United States Patent [19]

Adrian et al.

[11] Patent Number: 5,617,058
[45] Date of Patent: Apr. 1, 1997

[54] DIGITAL SIGNAL PROCESSING FOR LINEARIZATION OF SMALL INPUT SIGNALS TO A TRI-STATE POWER SWITCH

[75] Inventors: Andrew A. Adrian, Melrose; Michael S. Danielson, Wrentham; David B. Meyers, Walpole; Leo Spiegel, Sharon, all of Mass.

[73] Assignee: Apogee Technology, Inc., Norwood, Mass.

[21] Appl. No.: 556,615

[22] Filed: Nov. 13, 1995

[51] Int. Cl.$^6$ ............................................. H03F 3/38
[52] U.S. Cl. ...................... 330/10; 330/251; 330/207 A; 330/149
[58] Field of Search ............................ 330/10, 146, 149, 330/207 A, 251

[56] References Cited

U.S. PATENT DOCUMENTS

| | | | |
|---|---|---|---|
| 3,854,100 | 12/1974 | Pouzadoux | 330/251 |
| 3,919,656 | 11/1975 | Sokal et al. | |
| 4,292,581 | 9/1981 | Tan | |
| 4,357,489 | 11/1982 | Henderson et al. | |
| 4,475,151 | 10/1984 | Philipp | |
| 4,620,143 | 10/1986 | Matty | |
| 4,636,711 | 1/1987 | Freymuth | 323/282 |
| 4,745,368 | 5/1988 | Lodahl | |
| 4,924,373 | 5/1990 | Inaba et al. | |
| 5,049,832 | 9/1991 | Cavers | |
| 5,077,539 | 12/1991 | Howatt | |
| 5,077,540 | 12/1991 | Keith et al. | |
| 5,126,684 | 6/1992 | Solomon | |
| 5,191,597 | 3/1993 | Ekelund et al. | |
| 5,398,003 | 3/1995 | Heyl et al. | |
| 5,438,694 | 8/1995 | Muri et al. | 330/10 X |

OTHER PUBLICATIONS

"New Results in PWM for Digital Power Amplification," presented at the 89th Audio Engineering Society (AES) convention, Sep. 21–25, 1990, Session–Paper No. E–6, Preprint No. 2959.

"Realizing an all Digital Power Amplifier," presented at the 89th Audio Engineering Society (AES) convention, Sep. 21–25, 1990, Session–Paper No. E–6, Preprint No. 2960.

Primary Examiner—James B. Mullins
Attorney, Agent, or Firm—Brian L. Michaelis

[57] ABSTRACT

An all digital switching amplifier wherein linearization of the power switch is accomplished solely by using three states. A small, fixed width, bi-state compensating carrier waveform is added to the leading or training edges of an oversampled main input pulse producing a compensated composite waveform. This compensating carrier linearizes output from a power switch by effecting common mode cancellation of switch time errors. Output pulse width combinations for the compensating carrier are obtained from a look-up table stored in memory. A correction mechanism is implemented to correct for harmonic distortion that is dependent on the modulation level or index and results from the compensating carrier modulation. The correction mechanism applies the inverse of the modulation induced distortion to the oversampled compensated composite input signal to null distortion products resulting from the modulation scheme used to apply the small carrier to linearize the performance of the tri-state power switch. Digital timing control of the power switch's deadband ensures accuracy of the timing and sequence in which individual switches within the power switch H-bridge are turned off and turned on, so as to preclude a short circuit across the power supply. A high speed clock used in linearizing the power switch provides a timing reference to generate the necessary deadband timing delays and pulse width increments. The output bridge uses enhancement mode MOSFETs.

18 Claims, 13 Drawing Sheets

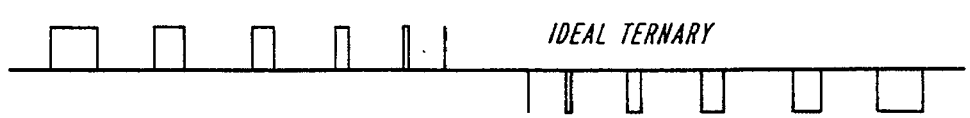
FIG. 1A (PRIOR ART)
FIG. 1B (PRIOR ART)
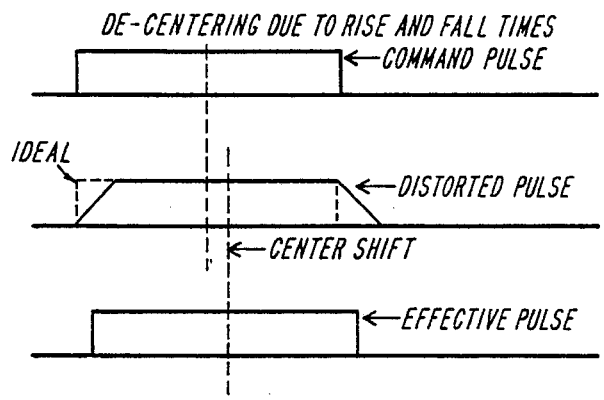
FIG. 2A (PRIOR ART)
FIG. 2B (PRIOR ART)
FIG. 2C (PRIOR ART)
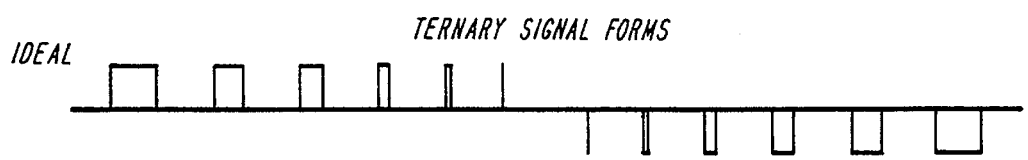
FIG. 3A (PRIOR ART)
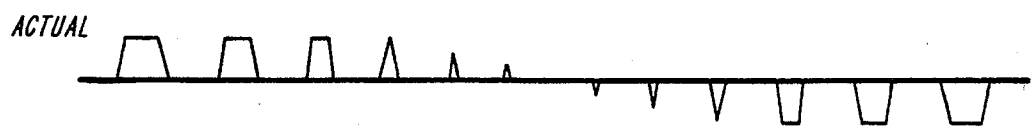
FIG. 3B (PRIOR ART)
FIG. 3C (PRIOR ART)

DIGITAL SIGNAL PROCESSING FOR LINEARIZATION OF SMALL INPUT SIGNALS TO A TRI-STATE POWER SWITCH

FIELD OF THE INVENTION

The present invention relates generally to power switching amplifiers, and more particularly to an all digital method and apparatus for linearizing small input signals to a tri-state power switch in a switching amplifier.

BACKGROUND OF THE INVENTION

The disadvantages of analog amplifiers are well known, and numerous mechanisms have been implemented in the art to overcome their deficiencies. Efforts to overcome the poor efficiency of analog amplifiers, among other things, gave rise to the development of relatively higher efficiency switching amplifiers. However, switching amplifiers have their own deficiencies, including difficulties in processing small signals without undesirable distortion. Binary switching amplifiers, in particular, are known to produce ripple in small output signals, when a modulation carrier frequency is removed from the amplified signal.

Mechanisms to improve upon the performance of binary switching amplifiers have involved implementing more output switching states. The conventional two output states of binary switching amplifiers have been supplemented, and performance has been improved by known switching amplifiers implementing third ("ternary") and fourth ("quaternary") output switching states. For instance, U.S. Pat. No. 5,077,539 ("the '539 patent") issued Dec. 31, 1991, owned by the present assignee and incorporated herein by reference, describes ternary and quaternary modes of switching operation implemented in an amplifier design to overcomes distortion affecting small signal inputs to the switching amplifier.

Ternary or tri-state mode waveforms represent input signal amplitude information as the timed width and polarity of pulses, comprising discrete amplitudes of zero, positive or negative polarity. With ternary techniques signal information is directly converted to appropriately wide pulses of positive or negative polarity.

The ternary implementation as disclosed in the referenced patent, however, contains an error source which precludes its use in audio or servo motor amplifier applications. This error source produces output signal distortion because of a non-linearity in the output transfer function for small input signals, specifically as the input signal transitions through zero. For small input signals, performance degradation results because of the finite rise and fall times of the output signals produced by the power switching circuit. These switch times represent a fixed magnitude error, subtracted from a diminishing magnitude signal, which produces a nonlinear gain characteristic resulting in signal distortion.

In order to overcome the nonlinear behavior of the tri-state embodiment, it is known in the prior art to introduce a fourth state, specifically to linearize the output transition through zero. For small input signals, the four-state or quaternary embodiment, which is described in detail in the referenced patent, employs an analog amplifier to affect a linear transition through zero. This fourth output state employs a linear analog amplifier in conjunction with ternary switching to linearize small signal performance. Below a predetermined signal magnitude the load is switched to the linear analog amplifier and the ternary power switch is disabled. Above the magnitude threshold, the power switch is enabled and the load is disconnected from the linear amplifier. This compromise solution offers certain advantages, however, like the binary and ternary implementations it suffers particular disadvantages.

The ternary and quaternary techniques known in the prior art accept an analog input signal, which in those analog implementations requires no signal conversion means to interface to a linear analog amplifier. In those implementations, all signal processing uses analog means, i.e. analog circuitry is used to implement signal conversion, pulse width modulation control, and output linearization for small signals.

One significant disadvantage of using analog means according to the prior art to configure a switching amplifier having desired performance characteristics is that analog implementations are not the most cost effective. The nature of the analog circuitry involved is such that some of the circuitry is incompatible for purposes of integration with other of the analog circuits. For instance, high speed comparator circuitry is not cheaply nor easily integrated with high accuracy sampling circuitry onto a monolithic integrated circuit. Thus, although high performance objectives are nearly obtainable with analog implementations known in thee art, such implementations suffer a significant economic handicap in that compact, very large scale integrated circuits can not be used to economically implement analog designs. Reduction of costs and integration of individual circuit components is difficult, requiring circuits to be partitioned into several analog application specific integrated circuits (ASICs). It logically follows that where the circuitry can not easily and economically be configured in a monolithic integrated circuit, such a non-integrated configuration will require more space to implement.

Furthermore, for amplifier input signals that are inherently digital, as from the output of digital audio media, CD-ROM, digital control systems, or the like, the analog prior art requires signal conversion circuitry to interface with the analog switching amplifier implementation(s). Interface circuitry at the front end of the amplifier can degrade performance and further burden system cost.

Additionally, design constraints for the analog amplifier used in the fourth state of the quaternary implementation are severe, requiring several parameters to be matched to the tri-state amplifier. Significantly, the transfer function of the analog amplifier switched in, in the fourth state, must be matched to the ternary output. Also, the output impedance of the ternary amplifier and the analog amplifier for the quaternary mode must be matched. Consequently, mismatches in parameters results in distortion of the output signal in prior art amplifiers. Performance is further degraded by noise resulting from the switching in and out of the quaternary state analog amplifier. The analog amplifier required in the fourth state also necessitates provision of additional components, adding significantly to system cost.

Similarly, digital switching amplifiers known in the prior art suffer from various disadvantageous aspects. Amplifiers in the prior art fully implemented in the digital domain suffer signal degradation and distortion with low level input signals, as do the analog implementations. It is appreciated in the prior art that high performance objectives are theoretically achievable with an all digital implementation, as suggested in two Audio Engineering Society papers published by the Audio Engineering Society, entitled REALIZING AN ALL DIGITAL POWER AMPLIFIER, presented by R. E. Hiorns. J. M. Goldberg and M. B. Sandler at the 89th Convention of Audio Engineering Society, 1990, Los Angeles, Preprint #2960 and NEW RESULTS IN PWM FOR DIGITAL POWER AMPLIFICATION presented by J. M. Goldberg and M. B. Sandler at the 89th Convention of Audio Engineering Society, 1990, Los Angeles, Preprint #2959, respectively. However, as mentioned in the papers, "It should be noted that the non-idealities of the power switch are not included in the simulation." Reality dictates that the theoretically achievable performance of an all digital amplifier is asymptotically bounded by the performance of the power switch interacting with the load. The non-linearity of power switches in reality heretofore presented a significant impediment to achieving truly high performance and high fidelity in an all digital switching amplifier implementation.

SUMMARY OF THE INVENTION

The present invention provides an all digital switching amplifier wherein linearization of the power switch is accomplished solely by using three states.

According to the invention, in an all digital implementation, a small, fixed width, bi-state compensating pulse waveform is added to the leading or trailing edges of an oversampled main input pulse producing a compensated composite waveform. This compensating pulse linearizes output from a power switch by effecting common mode cancellation of switch time errors. A composite waveform including the compensating pulse is implemented in a computationally efficient manner that obtains all of the pulse width combinations to be output from a look-up table stored in memory, rather than being computed on the fly, i.e., in real time.

A correction mechanism is implemented to correct for harmonic distortion resulting from the compensation pulse, also referred to as the pulse carrier or carrier, that is dependent on the modulation level or index. Harmonic distortion is corrected by the correction mechanism applying the inverse of the modulation induced distortion to the oversampled input signal. The correction mechanism effects preprocessing of input signal amplitude information so as to null distortion products resulting from the modulation scheme used to apply the small carrier to linearize the performance of the tri-state power switch.

The correction mechanism is implemented using digital signal processing (DSP) that facilitates application of the inverse of the modulation induced distortion to the oversampled input signal. Coefficients required by the correction mechanism to compute the induced distortion correction are derived from a look up table referenced by the estimated amplitude of the input signal.

In further accord with the invention, digital timing control of the power switch's deadband is effected. Digital deadband control ensures accuracy of the timing and sequence in which individual switches within a power switch H-bridge are turned off and turned on, so as to preclude a situation where both upper and lower switches on one side of the bridge are both turned on at the same time. Accurate digital timing, appropriately sequences the break-before-make switch timing, avoiding a short circuit across the power supply. In the all digital design according to the invention, a high speed clock used to generate the pulse width modulated waveforms to linearize the output from the power switch by common mode cancellation of switch time errors, can also be used to provide a timing reference to generate the necessary deadband timing delays required for the power switches, producing a much more stable switching situation.

Additionally, in an all digital audio amplifier embodiment, each individual switch's timing can be adjusted appropriately to accomplish a zero-voltage switch transition between the main pulse and the compensating pulse by providing a short period in which none of the switches are turned on. A conventional bridge is implemented using enhancement mode MOSFETs so that current will continue to flow through the body source-drain diodes of the alternate two switches to be turned on causing the diodes to become forward biased. When the diodes are forward biased, the voltage across the off switches is substantially zero, permitting a cleaner turn-on.

Features of the all digital amplifier signal processing circuitry of the invention include low cost implementation in one or two all-digital application specific integrated circuits. Space requirements for implementation of power switching amplifiers is substantially reduced over prior art ternary or quaternary configurations. The advantages of ternary output modes are provided in a digital switching amplifier offering the small signal linearity benefits of binary switching. A compensated ternary digital switching amplifier according to the invention has inherent manufacturing cost advantages in that it requires one-half the modulator clock speed for the same performance as a binary implementation permitting confinement of the modulator clock speed to a reasonable (and more economical) magnitude. Modulator clock speed represents a significant influence on the manufacturing cost, determined by the precision required within the digital integrated circuit technology employed for the processing. It is therefore advantageous, according to the invention, to exploit the oversampling ratio, order of the noise shaper, and modulation type, consistent with the performance of the power switch, and enable a high degree of integration while minimizing cost.

There are also significant performance advantages from the perspective of power delivery. Effective amplifier damping, enabled by short circuiting of the load during the output's ternary zero-power state, provides superior dynamic braking. More efficient operation is provided with the compensated ternary switching operation, since the output circuitry dissipates power primarily in proportion to the output signal. Compensated ternary modulation is nearly carrier suppressed which contributes to overall high efficiency, since minimal power is used by a carrier. EMI/RFI emissions, a concern with any switched amplifier, are reduced since high frequency energy is minimized. Use of enhancement mode MOSFETs in an H-bridge switch configuration provides higher efficiency, faster switching speeds, and cleaner outputs with reduced EMI, in the context of an all digital amplifier embodiment. A compensated ternary modulated power output signal produces minimal ripple at the filtered output, particularly at low levels where the ripple magnitude is most degrading to signal performance.

In a high fidelity audio amplifier application low power losses allow substantial benefits in terms of cost, size, and weight of the amplifier and reduced cost, size, and weight of the associated power supply. Reduced size and weight translates into lower production and distribution costs.

BRIEF DESCRIPTION OF THE DRAWINGS

These and other features of the present invention will be better understood when reading the following detailed description taken together with the accompanying drawing wherein:

FIGS. 1A and 1B represent analog and digital ideal ternary amplifier signal waveforms, respectively, as understood in the prior art;

FIGS. 2A, 2B, and 2C illustrate, respectively: an ideal switch command pulse; the command pulse of FIG. 2A as distorted and center shifted as a result of the rise and fall time characteristics of a real switch; and the effective center shifted pulse resultant from the distorted pulse of FIG. 2B;

FIGS. 3A, 3B, and 3C illustrate, respectively, ideal, actual and effective prior art ternary amplifier pulse waveforms;

DETAILED DESCRIPTION

To understand the invention, it is helpful to discuss briefly the practical considerations that affect the overall performance of an all digital, ternary multi-state switching amplifier. In general, the amplifier circuitry is partitioned into two sections, a digital signal processing control section and a power application section. Within the signal processing, characteristics that determine performance are the oversampling ratio, noise shaping order, pulse width modulation type, and modulator clock speed. Within the power section, performance is determined by the proximity to ideal linear, monotonic behavior of the power switch's output amplitude-time product, responsive to the modulation input command.

For an ideal ternary amplifier reproducing an analog equivalent signal passing through zero, as in FIG. 1A, a pulse out of the amplifier would be perfectly square, as shown in FIG. 1B, and would decrease to zero as its width becomes infinitesimally small. The primary problem in implementing a digital ternary amplifier is that real world power switch devices do not produce ideal waveforms, but produce a distorted pulse due to parasitic reactances (capacitance and inductance) that require charging and discharging. This behavior is responsible for a significant non-linearity error source. A normal command pulse, as illustrated in FIG. 2A, is distorted by the finite rise and fall times of the switch elements. This distortion can be modeled as a trapezoidal pulse as shown in FIG. 2B.

As can be seen in FIG. 2B, one artifact of the non-ideal pulse is a change in the effective time center of the pulse energy. The effective pulse, as illustrated in FIG. 2C, is shifted as a function of both the time and shape of the rise and fall times of the non-ideal switch.

Figure 4:
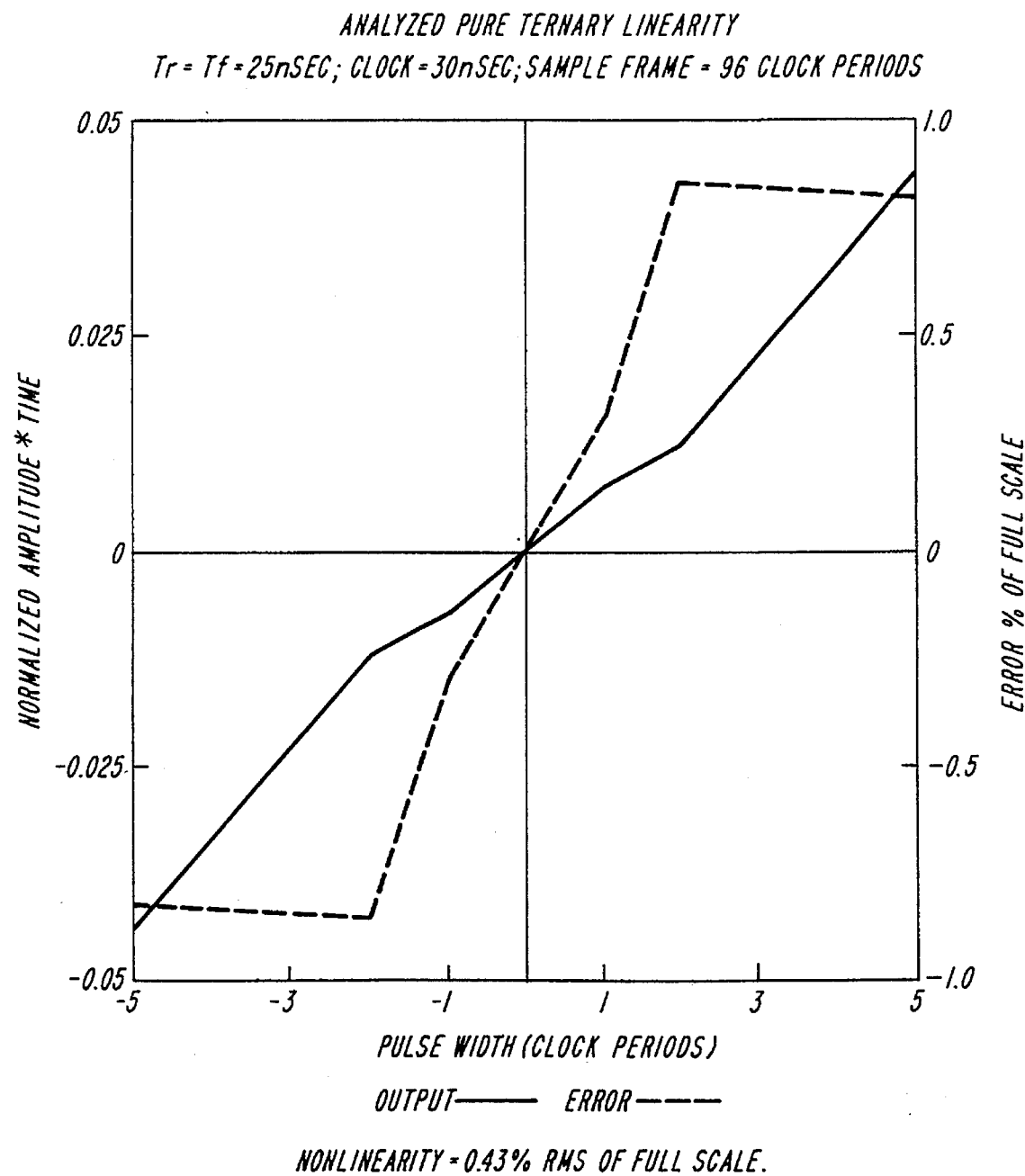
FIG. 4 is a graph depicting non-linearity at small signals of a pure ternary switching amplifier known in the prior art.

As disclosed in the referenced '539 patent, as the pulse width becomes smaller, as illustrated in FIG. 3A herein, its effective width becomes non-linear with time, as illustrated in FIG. 3B. As the pulse width decreases in time, the delivered energy is no longer a linear function of the time interval, but becomes a function of the rise and fall time as well as a function of pulse width. The effective pulse amplitude is not maintained, as illustrated in FIG. 3C. This causes the output gain to change as a function of pulse width. The non-ideal behavior adversely affects the amplitude to time conversion in known ternary amplifier implementations producing non-linearity at small signals and at the zero crossover. This is illustrated in a graph of the nonlinear gain characteristic of the power switch for small input signals in FIG. 4. The non-linearity threshold occurs when the power switch's rise and fall times exceed the width of the signal pulse, resulting in the triangular shaped pulses of diminishing amplitude (e.g. FIG. 3B). This non-linearity produces crossover distortion similar to that in Class B analog amplifiers.

Figure 5:
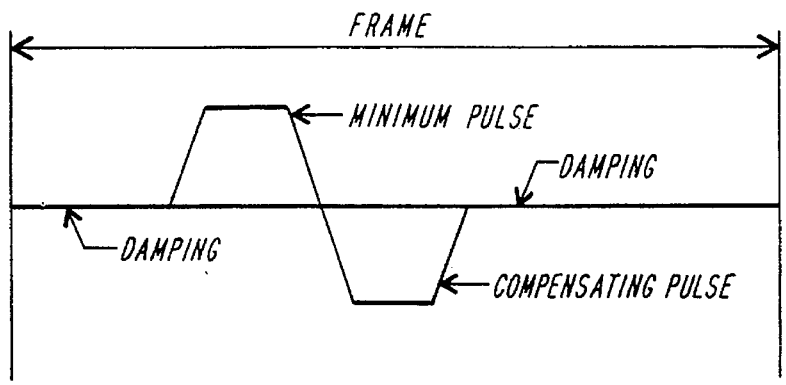
FIG. 5 is a representation of a minimum pulse and an opposite phase compensating pulse applied in a compensated ternary output switching amplifier according to the invention to overcome non-linearities introduced by non-ideal rise and fall times of power switching elements.

In an implementation of an all digital switching amplifier according to the invention, non-linearity introduced by non-ideal switches is compensated for by setting a minimum output pulse width such that the effective output pulse energy is not reduced by the non-ideal rise and fall times of the output switch elements. The effective pulse shape remains trapezoidal and does not become triangular. To compensate at the output for the effect of the non-ideal switch rise and fall times, the minimum output pulse is also applied to the load in opposite phase during the same frame to reproduce the waveform such as illustrated in FIG. 5.

The result of this waveform is that zero net energy is delivered to the load during the frame. As the minimum and compensating pulses are applied within a fraction of the frame of each other, and variations in power supply voltage or load characteristics due to external influences occur at much lower than the frame rate, the compensation is not dependent on factors external to the switch. The compensation is dependent on the matching of the switch elements, as different elements may have different rise and fall times. For discrete switch elements of the same type or for a monolithic construction of the switch, these differences are minimal. The compensation is also dependent on the timing characteristics of the switch driver and logic circuits used to convert the word from the signal processor to the output pulsed widths. Careful consideration to the timing characteristic of these elements has been made to minimize the differences in producing positive and negative pulses. During the time of a single frame, any remaining difference can be considered invariant and does not affect the performance of the compensation. A net residual difference between the two pulses results in a fixed offset of the zero output. This offset may be compensated by subtraction from the original digital data but is generally negligible for most applications, as are changes in the offset due to external influence such as time and temperature.

When a signal is applied, the resulting effective pulse width is then only dependent on the time increment commanded. The output resolution is therefore only limited by the ability to control the relative increment, which can be extended to effect continuous control of the pulse width.

Figure 6A:
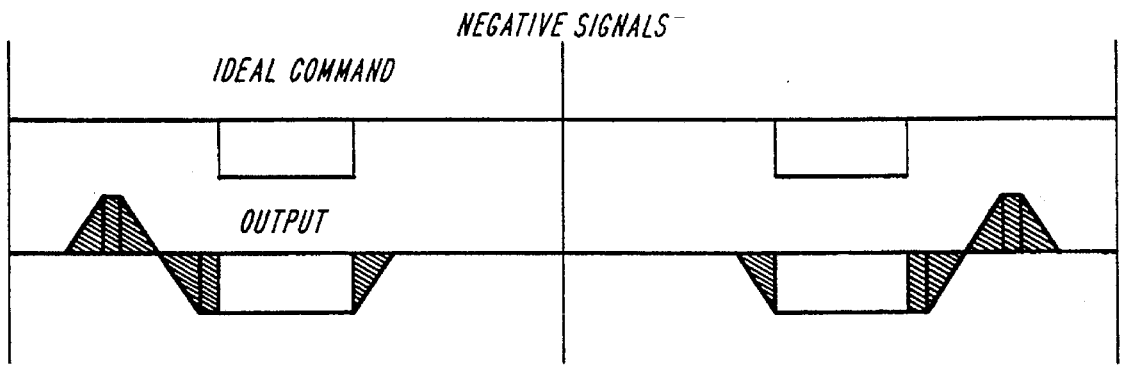
FIGS. 6A and 6B illustrate the cancellation energy provided by the compensation pulse of FIG. 5 and from a compensating pulse introduced before or after a command signal.
Figure 6B:
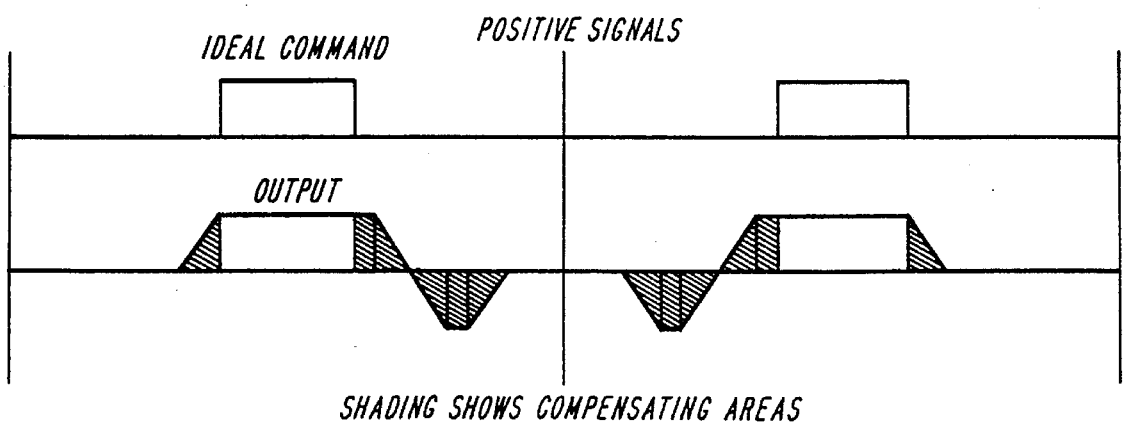
Figure 7:
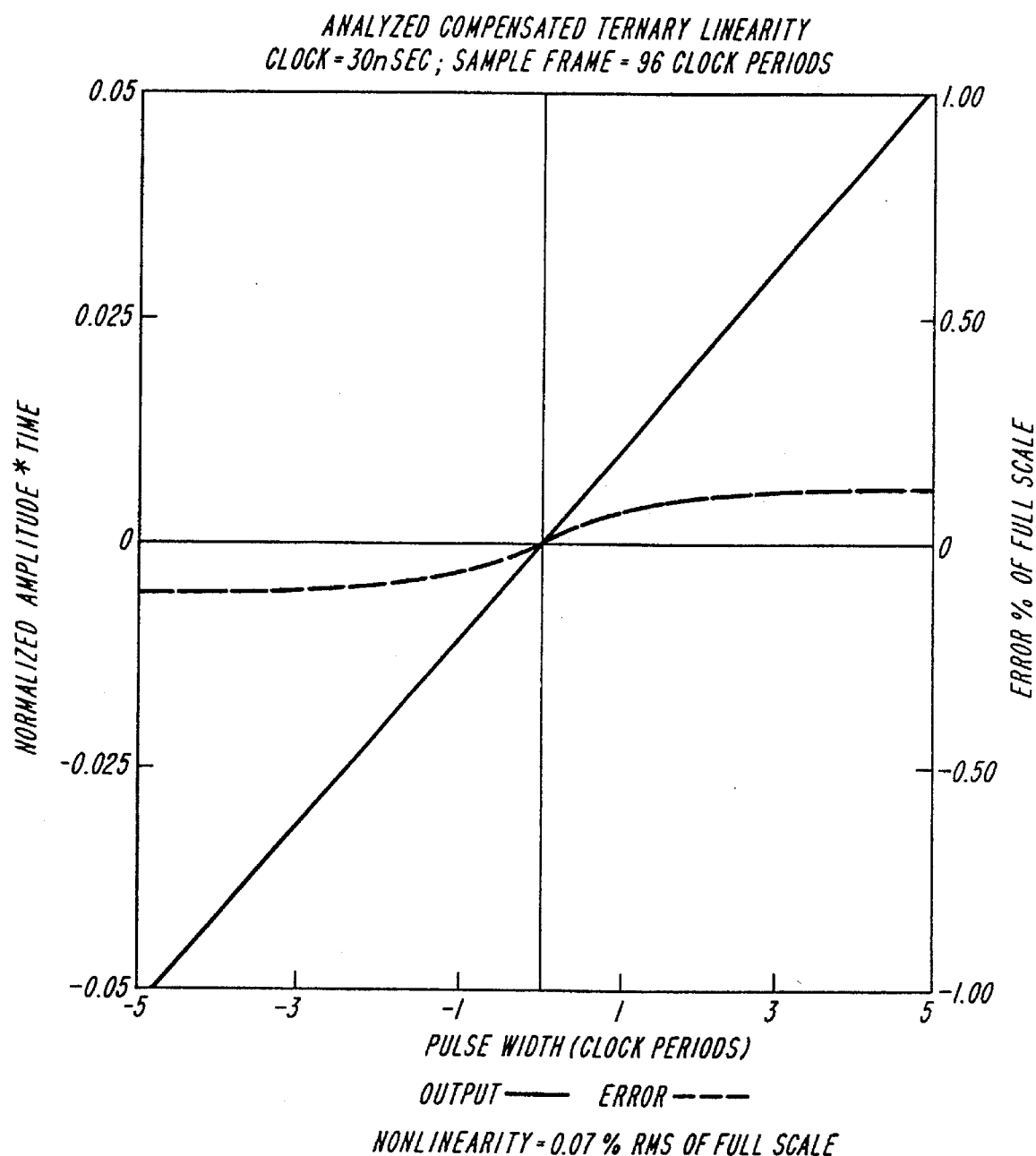
FIG. 7 is a graph depicting substantial linearity of an output of a compensated ternary switching output according to the invention.

FIG. 6A and 6B illustrate, respectively, the negative and positive compensated outputs derived from the ideal pulse command. The cancellation provided by the minimum pulse and the compensating pulse leave an effective net energy that is only dependent on the ideal commanded width. According to the invention, as discussed in greater detail hereinafter, the modulation commands, i.e. minimum and compensating pulse, are stored in a pulse command table, rather than being computed on the fly. The output of a noise shaper points to the pulse command table. The substantially linear output resulting from application of the compensating pulse(s) is illustrated in FIG. 7.

It should be noted that the energy center of the effective, i.e. compensated, pulse is a function of the commanded pulse width and whether the compensating pulse is applied before or after the desired polarity. To prevent the modulation energy center from shifting due to the addition of the compensating pulse, digital signal processing (DSP) may be used to calculate the new energy center of the output and pre-compensate for any harmonic distortion that might result. The DSP will effect starting of the output pulse earlier or later in the frame as is appropriate. Ultimately, it is more computationally efficient to preload the pulse command table with a pre-compensated delay word. Such pre-compensation according to the invention may only be necessary where very high performance is desirable, such as an amplifier application wherein the load is provided by very revealing speakers.

Figure 8A:
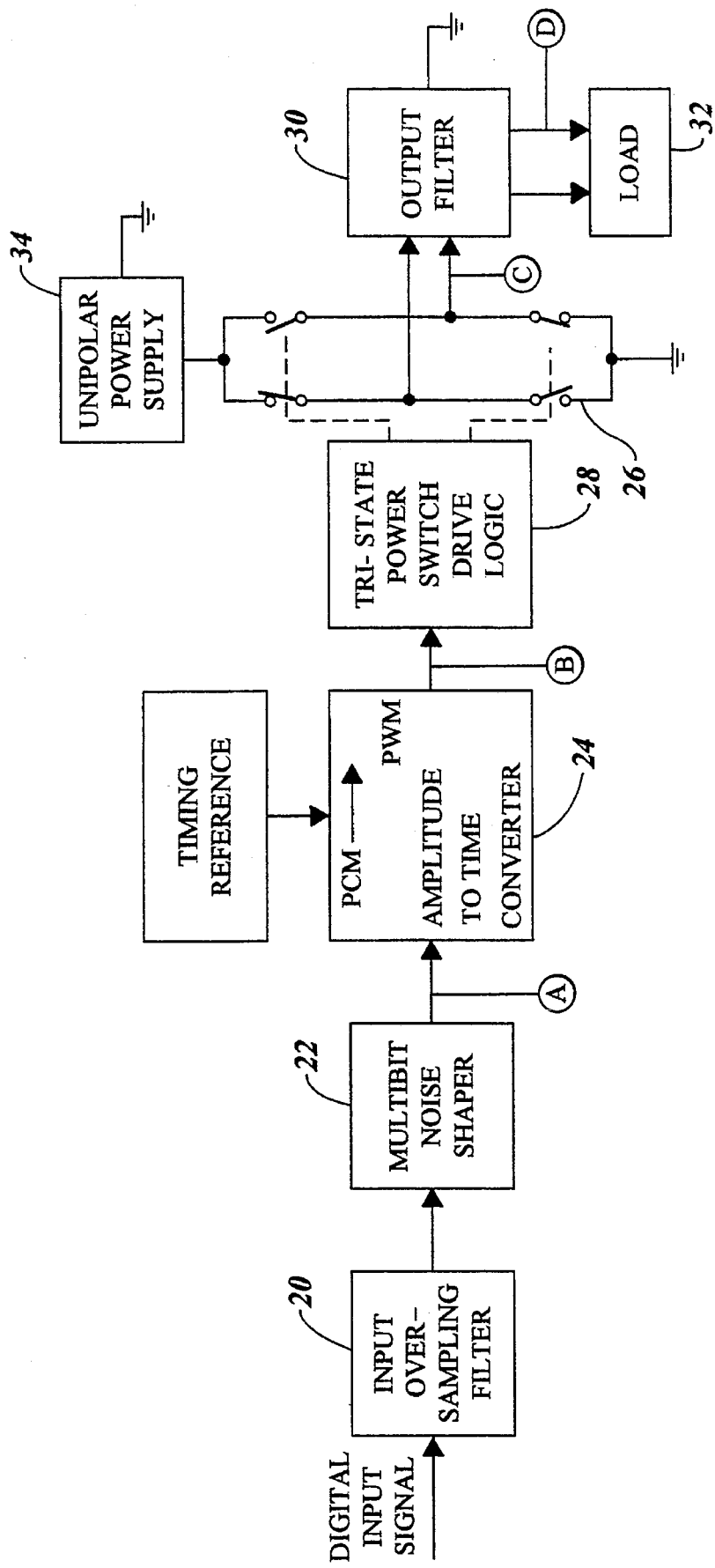
FIGS. 8A and 8B are general block diagrams of compensated ternary switching amplifier embodiments according to the invention.

A particular embodiment of a compensated ternary audio power amplifier is illustrated generally in FIG. 8A, with a portion of an input signal (e.g. sevensample frames) at various stages illustrated in FIGS. 9A, 9B, 9C and 9D. The embodiment of the all digital switching amplifier presented, includes an input over-sampling filter 20 which receives a pulse code modulated (PCM) digital input signal. PCM digital inputs are first oversampled using a digital interpolation filter, as known in the art. Oversampled PCM data are supplied to a multibit noise shaper 22 which frequency shapes quantization error, enabling a reduction in signal wordlength for a given signal-to-noise requirement. Reduction in signal wordlength is important, since oversampling ratio, signal wordlength, and modulation type determine the required modulator clock speed. Particular implementations of the noise shaper 22 and input over-sampling filter 20 are described in greater detail hereinafter, as both are implemented in a digital signal processor integrated circuit.

Figure 9A:
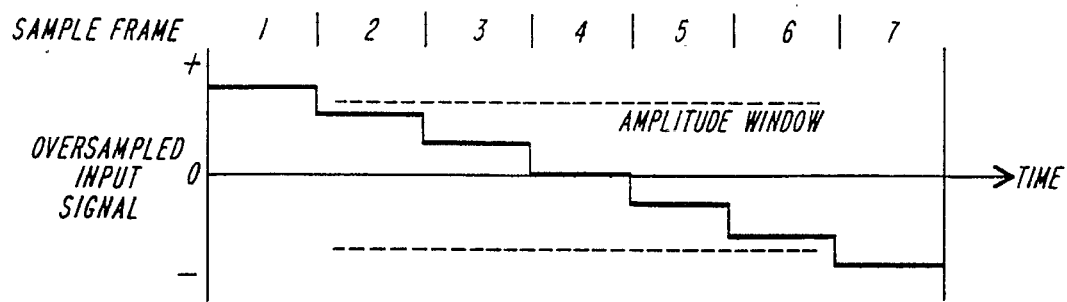
FIGS. 9A, 9B, 9C and 9D are, respectively, input signal, switch command signal, switch output signal and filtered output signal of the compensated ternary switching amplifier of FIGS. 8A and 8B.
Figure 9B:
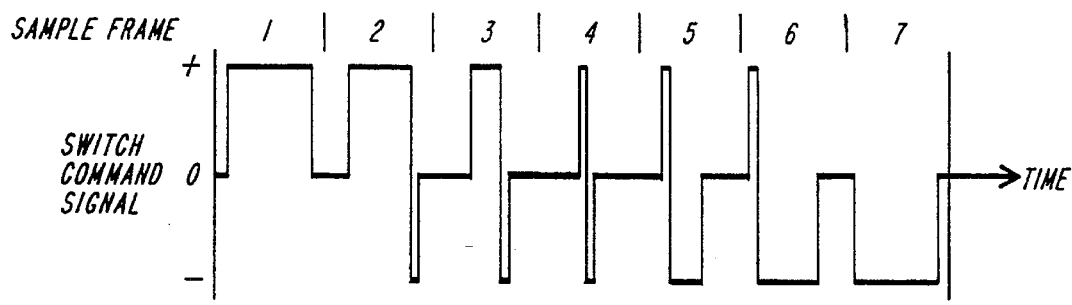
Figure 9C:
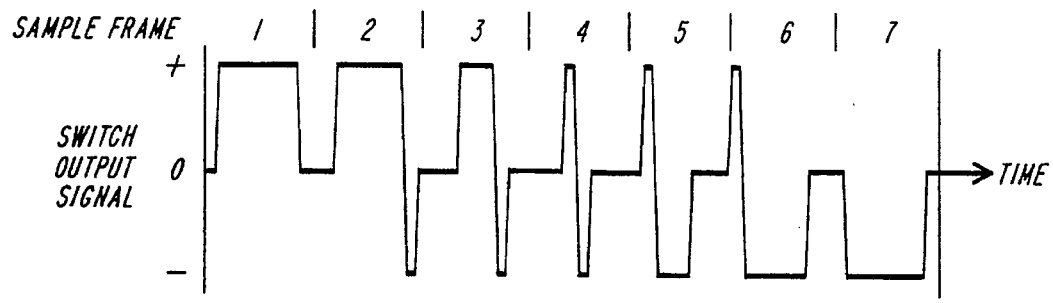

An over-sampled input signal, such as illustrated in FIG. 9A, is comprised of digital signals, or binary words, representative of amplitudes of the input signal. Signal processing continues whereupon the oversampled, noise-shaped, PCM data is applied to an amplitude-to-time converter 24 (i.e. at "A" of FIG. 8A). The amplitude-to-time converter 24 produces variable width pulses (i.e. at "B" of FIG. 8A), centered on regular timing markers which are an integral multiple of the modulator clock period, as shown in FIG. 9B, responsive to the oversampled input command (FIG. 9A). For input signals below a predetermined magnitude, a small carrier is introduced (sample frames 2 through 6 of FIG. 9B) with the signal. The carrier compensates for the rise and fall time non-idealities of the power switches 26 as illustrated in FIG. 9C. The positive and negative energy of the carrier cancels and has the affect of linearizing the output power switch 26 as the input signal transitions through zero. The introduction of the carrier precludes the production of triangular pulses at very small signals (such as discussed with respect to FIG. 3B), since the carrier pulse width is commanded to exceed the switch times. The presence of the carrier also eliminates the zero offset difference between the positive and negative output slopes (FIG. 4), producing a monotonic linear response through zero (FIG. 7).

Figure 9D:
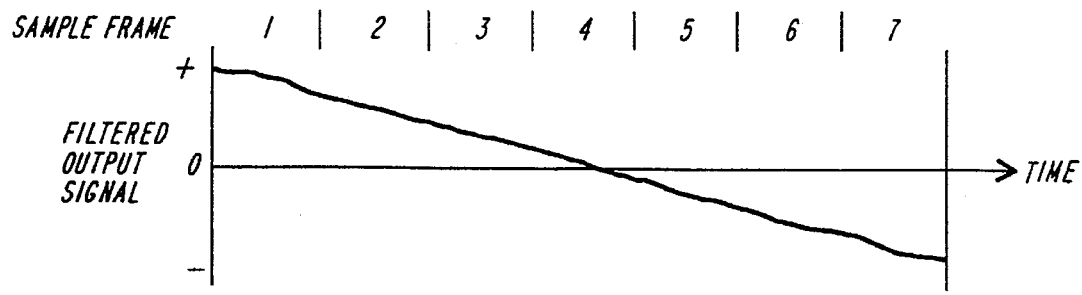

For input signals above the predetermined magnitude, the modulation signal is fully carrier suppressed. The introduction of the small carrier for lower level signal inputs does, however, marginally increase the ripple magnitude at the filtered output of the amplifier (i.e. at "D" of FIG. 8A), as illustrated in FIG. 9D. Nonetheless, such ripple is not nearly the same magnitude ripple increase as would be present in a binary switched output. The small carrier dramatically improves the gain slope linearity of the output power switch's amplitude-time product, a benefit that far outweighs the consequence of marginally higher ripple.

The command pulses from the amplitude-to-time converter 24 are applied to switch drive logic 28 to enable individual switches 26 to connect a filter 30 and a load 32 to a power supply 34. The filter 30, provides common mode filtering of the carrier and harmonics thereof. The load 32 may be a 4 to 8 ohm audio transducer. In the embodiment of FIG. 8A, the power supply 34 is a unipolar power supply that can be connected in phase or out of phase. The switch drive logic 28, in accordance with the compensated ternary operation described herein, can also configure the switches 26 to connect a short circuit across the filter 30 and load 32. The filtered switching output signal substantially replicates the conversion of the input signal, with greater power, albeit with the presence of some ripple, as shown in FIG. 9D.

Figure 8B:
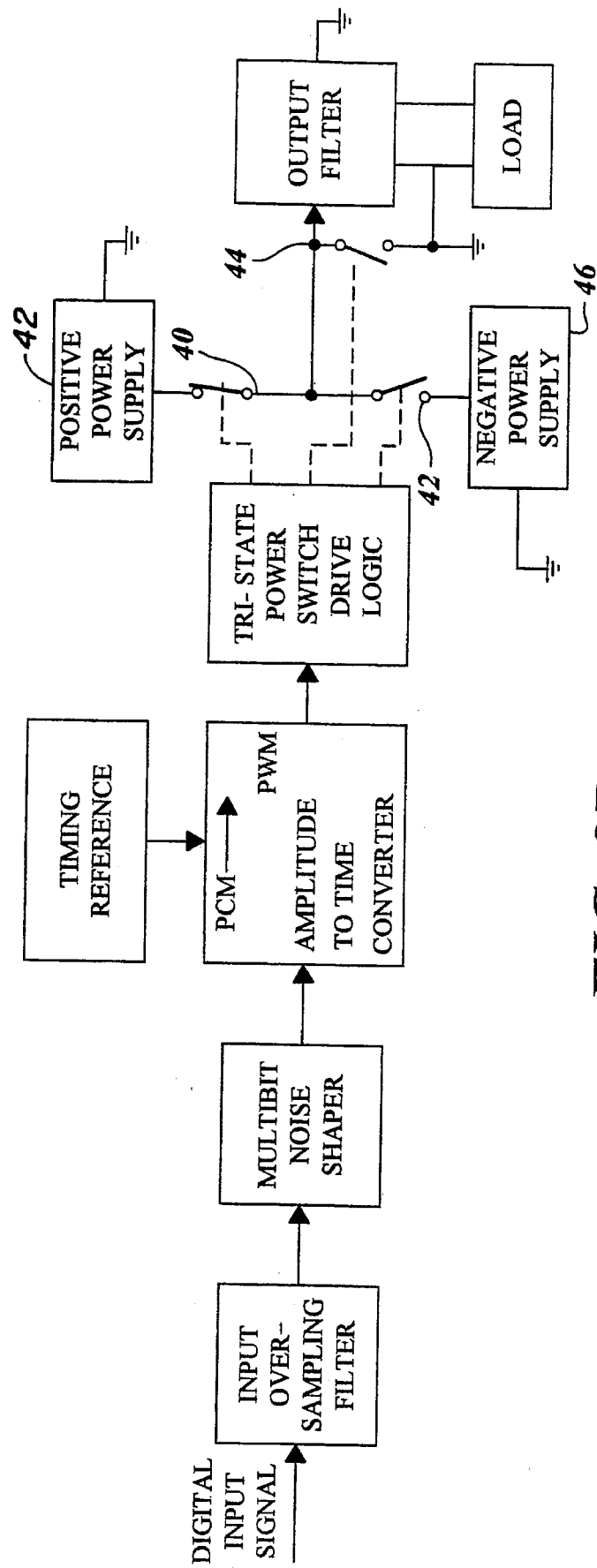

An alternative embodiment illustrated in FIG. 8B differs from the embodiment of FIG. 8A only by the manner in which power is sourced to the load. The embodiment of FIG. 8B incorporates three switches 40, 42, 44 and a bipolar power supply 46 to produce the discrete ternary modes, or zero, positive, and negative amplitudes. Positive power is delivered to the load by closing only switch 40, and negative power is delivered by closing only switch 42. The load is damped at zero power by closing only switch 44. The advantages of this alternate embodiment are:

1) higher efficiency, since only one switch closure is required to deliver power,
2) the ability to bridge amplifiers for higher output power, and
3) reduced output filter complexity, since a balanced filter is not required.

The disadvantage of this approach is the requirement for a bipolar power supply and its associated cost, size, and complexity.

Depending upon the desired performance criteria, the basic amplifier architecture described hereinbefore can be enhanced through supplemental signal processing more fully utilizing hardware already present in the design, e.g. the DSP. When considering the modulation performance, there are certain harmonically related distortion products inherent in the process of linearizing the switch output which can be predicted analytically from the modulation variables. These products can therefore be nulled by predisposing signal amplitudes to have the inverse distortion profile, i.e. predistorting the signal prior to introducing the modulation, as is described hereinafter with respect to a more particular embodiment of an audio amplifier according to the invention.

Figure 10:
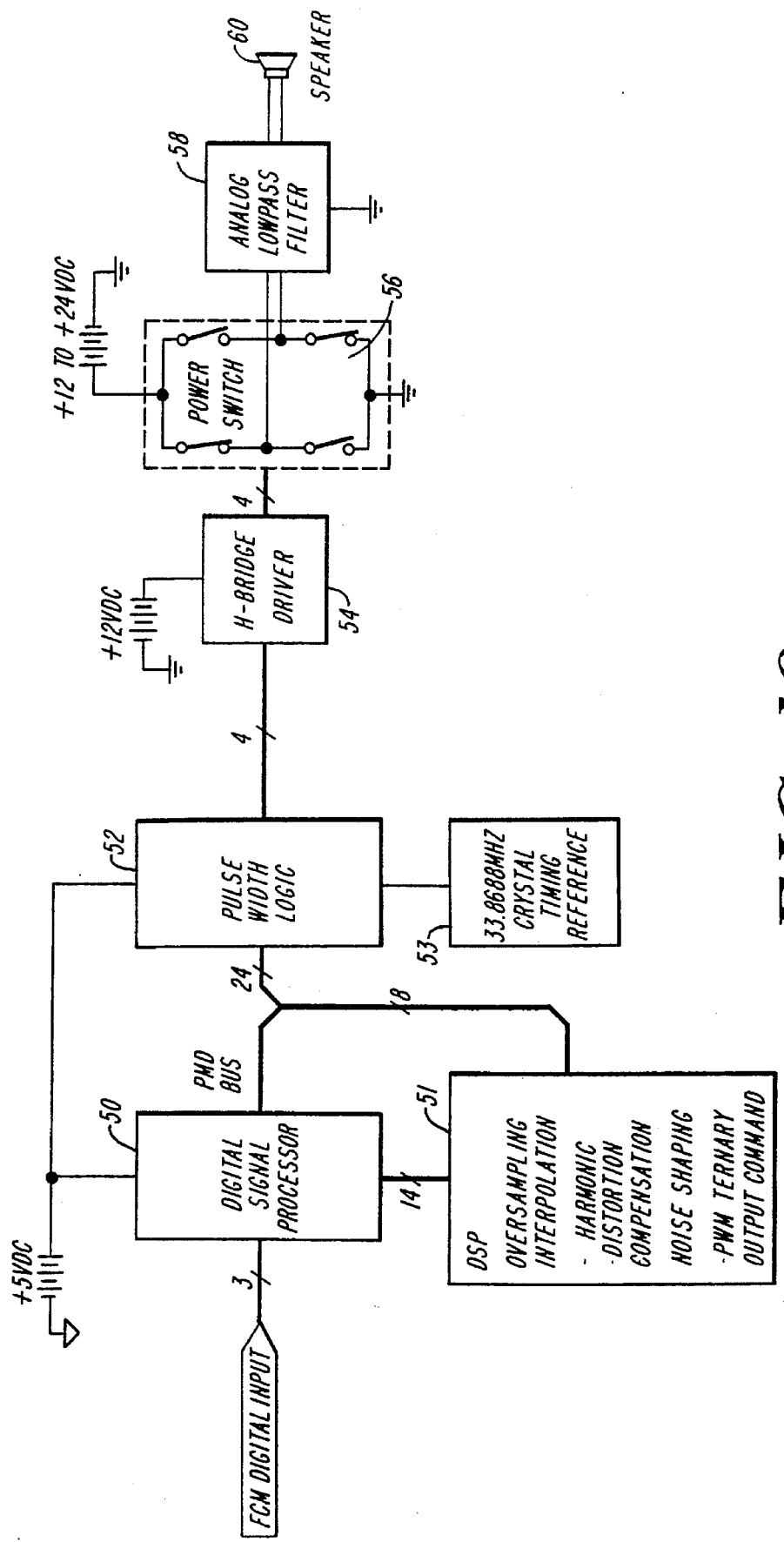
FIG. 10 is a more particular embodiment of a digital switching amplifier according to the invention.

In the more particular embodiment illustrated in FIG. 10, the digital switching amplifier accepts a pulse code modulated (PCM) digital input format, wherein discrete amplitudes, represented as binary numbers, are processed at fixed sampling time intervals. Standard interfaces, e.g., AES/EBU, S/PDIF, $I^2S$ serial, etc., are accommodated through the appropriate digital format conversion.

The specific embodiment of the amplifier illustrated in FIG. 10, utilizes a digital signal processor (DSP) 50 to condition the digital PCM input information to be a coded time modulated format. Initially, the digital amplifier converts the PCM digital data stream representing an analog waveform, e.g. 16 bit words at 44.1 kHz, into a pulse width modulation (PWM) stream using the DSP 50. The DSP 50 is configured to effect: an input oversampling interpolation filter (20 in FIG. 8A); a multibit noise shaper (22 in FIG. 8A); a modulation distortion pre-compensation or correction mechanism to correct harmonic distortion, and PWM control.

The oversampling interpolation filter combined with the noise shaper serve to modify the spectrum of quantization noise of the signal, reducing the noise floor within the required bandwidth. The signal is interpolated, increasing the sample rate, to provide spare bandwidth in which to displace the noise. The multibit noise shaper, using feedback around a quantizer, frequency shapes the spectrum of the quantization noise. This allows the noise shaper to produce a more coarsely quantized output at an oversampled rate, derived from a finely quantized input, while maintaining finely quantized resolution within the frequency band of interest.

The modulation approach developed to linearize the digital amplifier output, discussed hereinbefore and in more detail hereinafter with respect to the amplitude to time converter pulse width logic 52 of FIG. 10, produces harmonic distortion dependent on the modulation level or index. The DSP implements a modulation distortion pre-compensation or correction mechanism to correct harmonic distortion. The DSP determines and applies the inverse of the modulation induced distortion to the oversampled signal. Coefficients required by the DSP to effect modulation distortion pre-compensation are derived from a look up table referenced by the estimated amplitude of the input signal.

Figure 11:
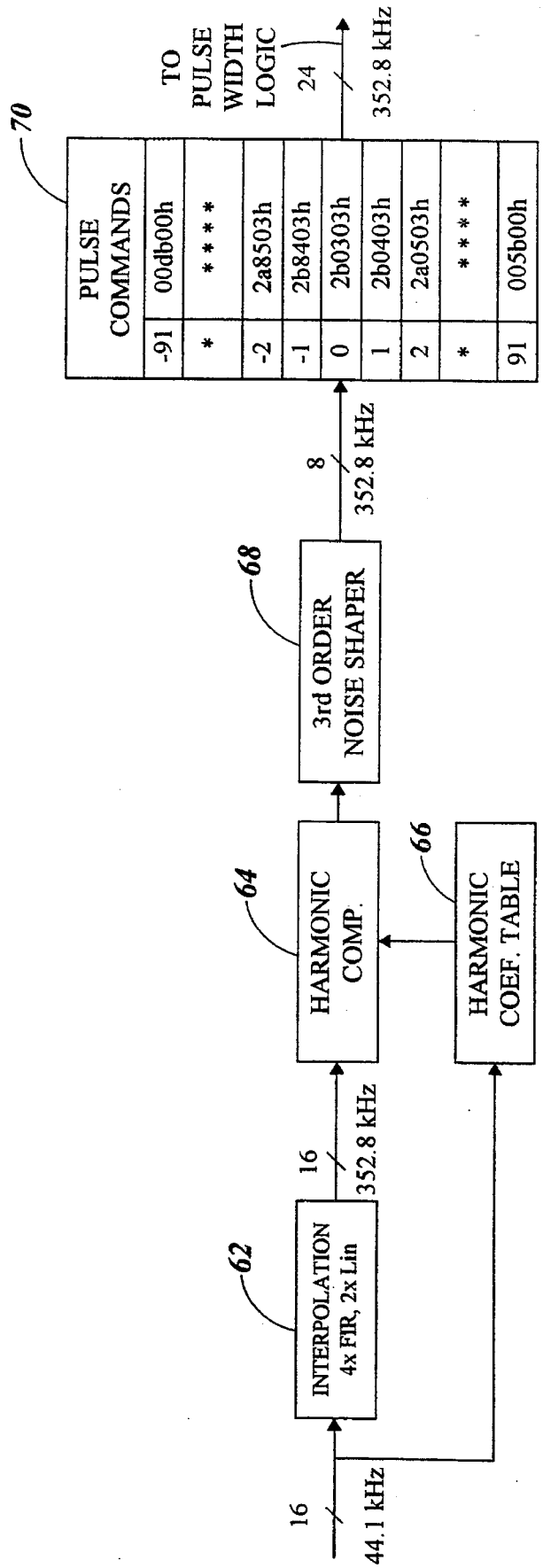
FIG. 11 is a block diagrammatic representation of functional elements implemented in a digital signal processor in the amplifier of FIG. 10.
Figure 12:
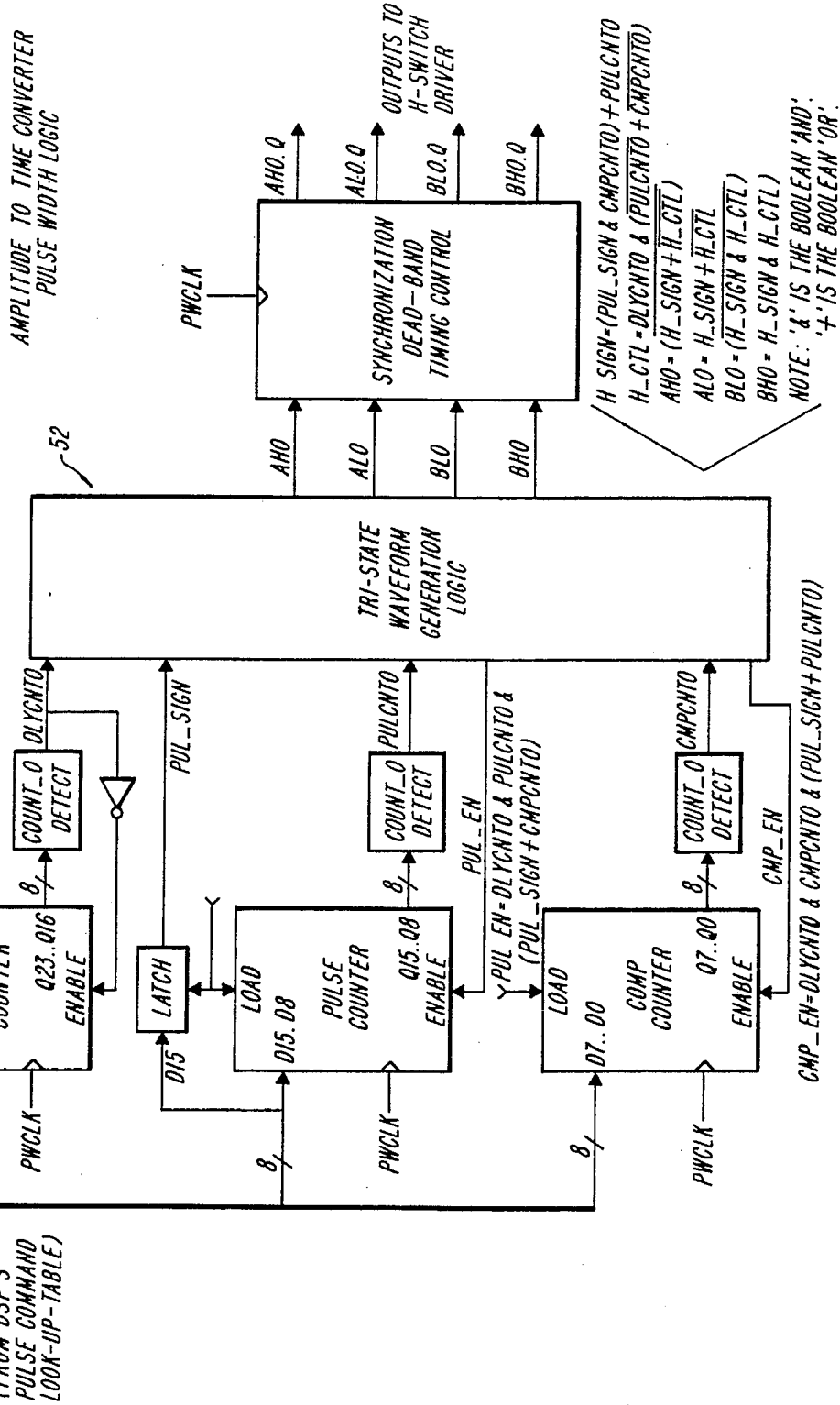
FIG. 12 is a block diagram of amplitude to time converter pulse width logic implemented in the amplifier of FIG. 10.

Referring now to FIGS. 10–12, the 44.1 kHz, 16 bit words are read through the DSP's serial input. After the words are read, an interrupt is generated to start processing. Code for configuring the DSP as described hereinafter is loaded upon initialization, from a Read Only Memory (ROM) 51, via an 8-bit bi-directional bus 53. The first stage in the processing after initialization increases the data samples by using a finite impulse response (FIR) low pass interpolation filter and linear interpolation. This produces a 16 bit signal at 352.8 kHz, or eight times (8×) oversampled.

The FIR filter and linear interpolation (62 in FIG. 11) are used to convert the 44.1 kHz, 16 bit signal into a 352.8 kHz signal, eight times oversampled. FIR filters are widely used in signal processing to do sample rate conversion (See, e.g. L. Rabiner and B. Gold, THEORY AND APPLICATION OF DIGITAL SIGNAL PROCESSING, Prentiss-Hall, 1975, which is hereby incorporated herein by reference).

The convolution equation for this filter is:

$$y(n) = \sum_{k=0}^{N-1} h(k) \cdot w(m-k)$$

where N is the number of filter coefficients or "taps" in h(k), w(m−k) is the rate expanded version of the input x(n), and w(m−k) is related to x(n) by:

$$w(m-k) = x\left(\frac{m-k}{L}\right)$$

for m−k=0, ±L, ±2L, . . . , or otherwise zero.

Two basic design approaches are used to compute FIR filters coefficients. The first are "window" designs and the second are equiripple designs. The coefficients for a window design are computed by multiplying a window function by the sinc function. For example, using a normalized 4-Term Blackman-Harris window given by:

$$BH(k) = \left(0.35875 - 0.48829 \cdot \cos\left(\frac{2 \cdot \pi \cdot k}{N}\right) + 0.14128 \cdot \cos\left(\frac{4 \cdot \pi \cdot k}{N}\right) - 0.01168 \cdot \cos\left(\frac{6 \cdot \pi \cdot k}{N}\right)\right) \frac{6}{\sqrt{N}}$$

the filter coefficients are:

$$h(k) = \frac{fc}{fs} \cdot 2 \cdot \text{sinc}\left[2 \cdot \pi \cdot \frac{fc}{fs} \cdot \left(k - \frac{N-1}{2}\right)\right] \cdot BH(k)$$

where fc is the filter break frequency, fs is the filter sampling frequency, and sinc(x)=sin(x)/x.

Equiripple coefficients are computed using computational techniques (e.g., Remez exchange algorithm). These designs trade bandpass ripple with filter roll off and stop band attenuation. Steep roll off can be achieved at the expense of bandpass ripple. Standard window designs do not introduce bandpass ripple (ignoring computational effects) but have limited stop band attenuation and roll off given the same number of filter taps.

FIR filter performance is a function of the number of taps used. A higher number of taps produces a steeper roll off and reduced band pass ripple for the equiripple designs. Thus, the number of filter taps must be traded off against the available computational throughput.

The interpolation approach for the digital amplifier described herein uses a 4× FIR interpolation filter along with a 2× linear interpolation to obtain the 8× oversampling output. A single stage windowed filter was selected over an equiripple design because of the computational simplicity and flexibility. The algorithms identified above were implemented to compute coefficients for a 120 tap 4× interpolation filter with a 22 kHz break frequency.

A DSP such as an Analog Devices ADSP-2101 Digital Signal Processor is used in this illustrative embodiment to effect the input oversampling interpolation (FIR) filter discussed hereinbefore, and the multibit noise shaper and modulation distortion pre-compensation or correction mechanism discussed hereinafter.

The processor includes the following functions:

Computational Units—16 Bit Arithmetic/logic unit (ALU), a 40 bit multiplier/accumulator (MAC), and a 32 bit barrel shifter.

Data Address Generators and Program Sequencer—Provides dedicated address generators to support single-cycle conditional branching and simultaneous addressing for dual operand fetches.

Serial Ports—Two double buffered serial ports.

The implementation of the DSP functions are performed using the fixed point computational units and the data address generators.

The ADSP-2101 DSP was designed for signal processing and implements FIR filter processing very efficiently using MAC instructions with address generators. The FIR filter is implemented by storing the input data into a circular buffer of length (n_taps/L) where n_ taps is the number of filter taps and L is the FIR oversampling rate (i.e., 4). A loop is then executed L times to generate each output. MAC operations are used to multiply the FIR coefficients by the input data buffer and accumulate. The ADSP MAC instruction is as follows:

$$mr=mr+mx0*my0(ss), mx0=dm(i2,m1), my0=pm(i6,m6);$$

where mr is the 40 bit accumulator (32 bits with 8 for overflow) and the registers mx0 and my0 are the current values of the input buffer and FIR coefficients obtained from circular buffers. The buffers are addressed using index registers i2 and i6 with step increments of m1 and m6. This combined instruction allows automatic loading of the next registers. This approach provides for a very efficient FIR filter implementation.

Figure 11A:
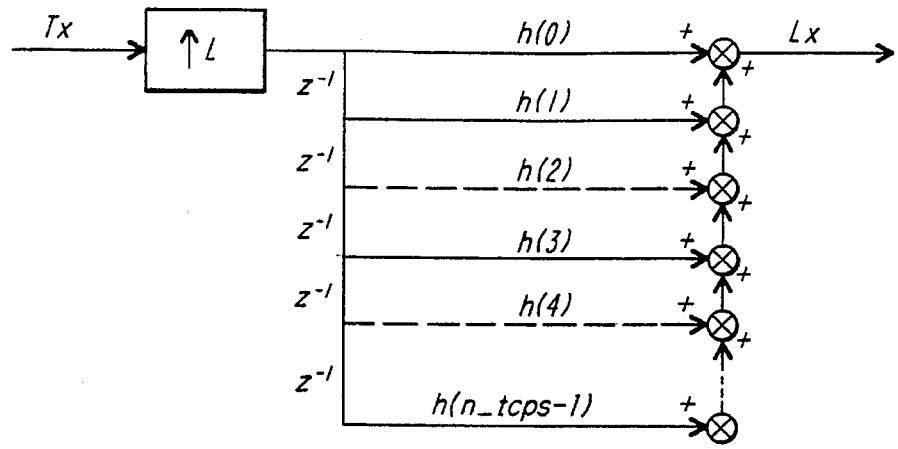
FIG. 11A is a signal flow diagram of an interpolation filter implemented in the digital signal processor in the amplifier of FIG. 10.

A flow diagram of the FIR filter is shown in FIG. 11A. The input signal is converted up an L rate by filling with zeros between the data. The stored input buffer is shown using the discrete operator (z) along with the multiply and summation to obtain a filter output at a sample rate of Lx.

Linear interpolation is used to obtain the final oversampling rate (Fs) of 8×. The number of instructions required to perform a single channel of the amplifier are listed in Table I.

TABLE I

| OPERATION | DATA MOVE | ALU | MAC (plus 2 Fetches) |
|---|---|---|---|
| Interpolation (4x FIR + 2x Lin) | 12 | L | n_taps + L |
| Harmonic Comp. | 6+2*L | 1 | 3+2*L |
| Noise Shaping | 10+3*Fs | 2*Fs | 5*Fs |

Again, the approach developed to linearize the digital amplifier output for switch non-idealities, as discussed herein, produces harmonic distortion dependent on the modulation level or index. To compensate this error, a harmonic distortion precompensation correction mechanism (64 in FIG. 11) was developed and implemented in the DSP to determine and apply the inverse of the modulation induced distortion to the oversampled signal. As previously indicated, the coefficients required by the DSP to effect modulation distortion pre-compensation are derived from a look up table (66 in FIG. 11) referenced by the estimated amplitude of the input signal.

The correction mechanism effects preprocessing of signal input amplitude information so as to null distortion products resulting from the modulation scheme. In effect, input amplitude information is corrected in accordance with output signal distortion produced by the modulation, which is proportional to the magnitude width of the carrier with respect to the sample frame. It is also proportional to the rate of change of the modulated pulses (i.e. the frequency of the input signal). This modulation induced distortion has an even harmonic relationship to the input signal. The even harmonic distortion created by linearizing for output switch rise and fall times is characterized as:

$$H(M,\omega) = M \cdot K_\omega(CP) \cdot \omega \cdot \left( \sum_{i=1}^{\infty} \frac{2}{i \cdot 2} \cdot SIN(2 \cdot i \cdot \omega \cdot t) \right)$$

The even harmonic distortion is linear with modulation index (M) and signal frequency $\omega$. Also, the amplitude reduces proportional to the harmonic (i.e., the fourth harmonic is a factor of two less than the second). The constant $K_\omega$ is a function of compensating pulse size. The amplifier design trade-off selected a compensating pulse large enough to prevent cross over distortion and produce the required linearity, but small enough to minimize harmonic distortion.

Because the form of the harmonic distortion introduced by the compensating pulse is understood, it can be removed by modifying the input. The first term (i.e., second harmonic) in the equation above reduces to:

$$H(M,\omega) = M \cdot K_\omega(CP) \cdot \omega \cdot \sin(s \cdot \cdot \omega \cdot t)$$

To generate a compensation signal, we use the relationship that:

$$\sin(2 \cdot \omega \cdot t) = 2 \cdot \sin(\omega \cdot t) \cdot \cos(\omega \cdot t)$$

assuming an input signal of $$a = A\sin(\omega \cdot t)$$

taking its derivative, we get $$\frac{da}{dt} = A \cdot \omega \cdot \cos(\omega \cdot t)$$

Multiplying the input by the derivative and accounting for the scaling, we can produce a compensation signal.

The input is corrected as follows:

$$a = a - \frac{2 \cdot K_\omega}{A} \cdot a \cdot \frac{da}{dt}$$

This approach can be further extended to eliminate the fourth and sixth harmonic. Using the first three terms in the compensation pulse distortion expression:

$$H(M,\omega) = M \cdot K_\omega(CP) \cdot \omega \cdot$$

$$\left[ \frac{1}{2} \cdot \sin(\omega \cdot t) \cdot \cos(\omega \cdot t) \cdot (3 - 8 \cdot \cos(\omega \cdot t)^2 + 16 \cdot \cos(\omega \cdot t)^4) \right]$$

A compensation equation can be generated by combining the input, the derivative and an integral of the input signal. The integral (ia) of the input is:

$$ia = \frac{-\cos(\omega \cdot t)}{\omega} \cdot A + C$$

By subtracting off the initial condition, dividing by the negative square of the amplitude, and multiplying the derivative times the integral we get:

$$\frac{(ia-C)}{-A^2} \cdot \frac{da}{dt} = \cos(\omega \cdot t)$$

Substituting this expression into the three term equation, we get a compensation equation given by:

$$a = a - K_\omega(CP) \cdot \left[ \frac{1}{2} \cdot \frac{a \cdot \frac{da}{dt}}{A} \cdot \left[ 3 - 8 \cdot \left[ \frac{\frac{da}{dt} \cdot (ia-C)}{A^2} \right] + 16 \cdot \left[ \frac{\frac{da}{dt} \cdot (ia-C)}{A^2} \right]^2 \right] \right]$$

To implement this equation, the input signals derivative (da/dt), integral (ia), amplitude (A), and integral initial condition (C) are computed from the digital data. The derivative is computed using a simple difference divided by the time increment of the interpolated data signals. The integral's initial condition is determined using a low pass filter to obtain the DC of the integral signal. The input signal amplitude is computed by low pass filtering the rectified input signal and scaling appropriately.

Figure 11B:
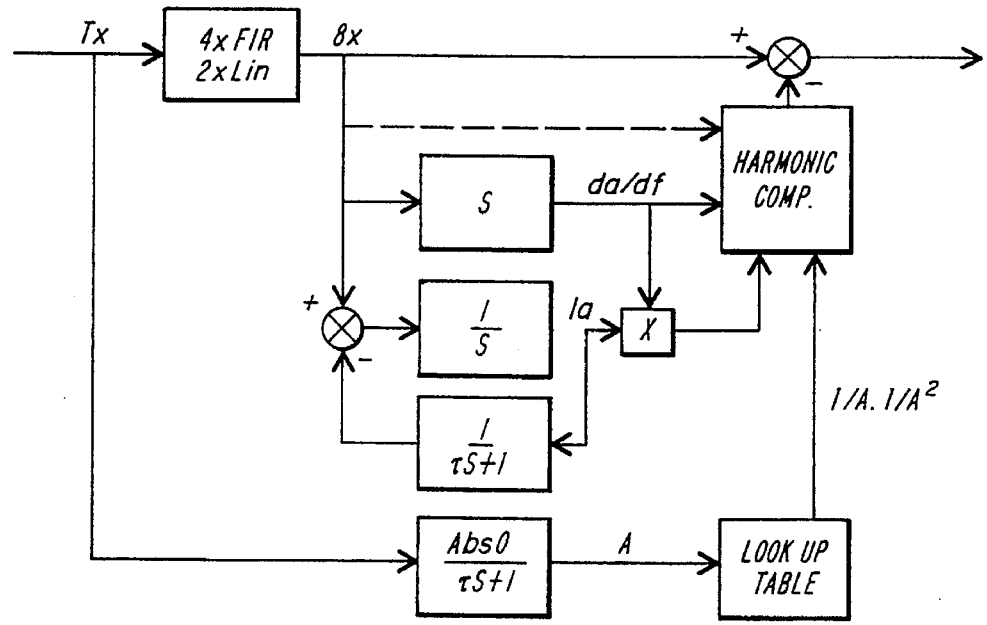
FIG. 11B is a harmonic compensation flow diagram implemented in a correction mechanism in the digital signal processor in the amplifier of FIG. 10.

The correction mechanism used to correct for the distortion introduced by the pulse width modulation scheme discussed hereinafter is also implemented on the ADSP-2101 DSP. Table I hereinbefore lists the number of instructions to implement second harmonic compensation. A signal flow diagram of the extended harmonic compensation method is shown in FIG. 11B. The transfer function terms are shown in Laplace for convenience. These transfer functions are implemented in the discrete domain in DSP code.

The multibit noise shaper (68 in FIG. 11), also implemented in the DSP, is used to overcome the noise and distortion produced by converting the 16 bit signal into the 8 bit output used to point to a 24 bit output lookup table. The amplifier output is based upon a ternary (plus, minus, and zero) PWM scheme that is controlled at the clock rate of the system. For an 8× oversampled system, a 33.8688 MHz clock is used to obtain frame width with 96 control values, or the equivalent of approximately ±6.6 bits. Because of this large quantization level, a noise shaper is used to shift the noise outside of the audio bandwidth.

The noise shaper used for this design is in the form of $$NS(z) = (1-z^{-1})^n$$

where z is the discrete operator and n is the order of the noise shaper.

A third order noise shaper was selected for the amplifier design. This is based upon a sensitivity analysis that compared base noise and harmonic distortion to noise shaping order. It should be noted that the even harmonic distortion introduced by the compensating pulse is not a function of the noise shaper order. The third harmonic, however, is a strong function of the noise shaper order. Significant reduction of this harmonic is not obtained by increasing the order beyond three.

Figure 11C:
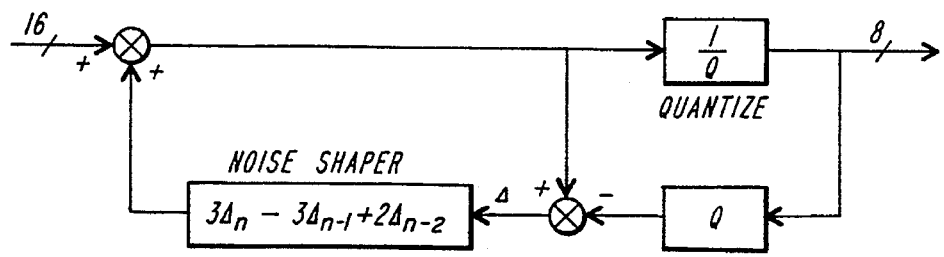
FIG. 11C is a signal flow diagram of a noise shaper implemented in the digital signal processor in the amplifier of FIG. 10.

The noise shaper implemented on the ADSP-2101 DSP and used to convert 16 bit interpolated values into eight bit values with approximately the same inband noise performance is illustrated as a signal flow diagram in FIG. 11C. The quantization process is shown as a division. The quantization remainder is provided as the feedback through the noise shaper. The number of instructions used to perform this operation are also listed in Table I as a function of the oversampling rate.

The output of the noise shaper, as illustrated in FIG. 11, is used to point to a pulse command table 70 to generate the modulation commands. The table contains 24 bit words representing; delay, first pulse width, and second pulse width commands. These are used by the amplifier control logic to produce outputs that vary between ±91 possible amplifier levels. It should be noted that in the present implementation, four pulse width quantization clock cycles are used for loading and one for margin. It should be possible to produce 96 levels at the carrier under clock control in a hardware implementation.

The 24 bit words representing delay, first pulse width, and second pulse width commands, i.e. coded time information output from the DSP, is further processed by the amplitude-to-time converter pulse width logic 52 (FIG. 10) to produce the compensated ternary pulse width modulated (PWM) drive signals. As illustrated in FIG. 10, the DSP outputs a 24-bit word on a parallel Program Memory Data (PMD) bus which is used as a convenient and efficient means to output the maximum information in a minimum time without taxing much overhead from the DSP.

The 24-bit word coded in the look-up table provides information regarding the delay time, width time of the signal pulse, and width time of the compensating pulse associated with the desired ternary waveform. The 24-bit word is put on the DSP's PMD bus and applied to the amplitude-to-time converter pulse width logic (52 in FIG. 10) illustrated further in FIG. 12. Coded time information is represented as increments of the high speed pulse width modulator clock (PWCLK). Delay information from the DSP 50 is used by the pulse width logic 52 to center the pulse energy and is dependent upon the signal amplitude. Signal pulse width information from the DSP 50 is used by the pulse width logic 52 to determine the desired power from the output of the amplifier. Compensating pulse width information from the DSP 50 is used by the pulse width logic 52 to linearize the power switch for small signals.

As illustrated in FIG. 12, the PMD bus is mapped to three 8-bit, synchronous, presettable binary down counters, one each for the delay time, signal pulse, and compensating pulse. FIG. 12 depicts 8-bit counters used in this implementation for flexibility. However, the actual size requirement of the counters is determined by the pulse width clock, the frame rate, and the data format. In applications where fewer than 8 bits may be implemented, the counters used may be sized accordingly. In the embodiment illustrated in FIG. 12, the logic functions are implemented for a signed-magnitude binary format requiring only down-counters. In the illustrative embodiment of an amplifier employing a 44.1 KHz input data rate, 8× oversampling of the input data providing a 352.8 KHz frame rate, and a 33.8688 MHz pulse width modulation clock, the sample frame is divided into 96 clock periods requiring 7-bits for the signal pulse width plus one bit for polarity. The maximum delay time is one-half the sample frame requiring 6-bits. The compensating pulse width is determined by the rise and fall times of the output power switch, so as to preclude triangular shaped pulses. For example, given a typical rise and fall times of 25 nsec, a compensating pulse width of 3 clock periods may provide good small signal linearity, requiring only 2-bits.

The counters are all loaded synchronously by a command signal initiated from the DSP. The counters are preset and decremented to zero once per frame time. The DSP controls the timing of this operation. Care is exercised to synchronize the pulse width modulation clock and the loading of the counters. The outputs of the counters are applied to the input of a zero-count detection circuit including three zero count detectors. Operation of this circuit provides a logic '1' only when the counter has decremented its output to be zero. The outputs from three zero-count detectors and the sign-bit from the signal pulse counter are applied to the "Tri-state Waveform Generation Logic". The waveform generation logic uses combinatorial logic to combine the outputs from the three zero-count detectors and the signal pulse sign-bit to produce four output control signals, AHO, ALO, BLO and BHO.

Additionally a synchronization circuit generates the necessary delay timing required to accomplish break-before-make of the power switches. Generally speaking, the time stability of the break-before-make delays is dramatically improved when these time delays are generated synchronous with the pulse-width modulation clock rather than when they are generated using analog techniques. The logic circuits also generate outputs to control the enabling sequence of the counters.

Operation of the amplitude-to-time converter pulse width logic 52, comprising the counters, zero detection circuits, and tri-state waveform generation logic is as follows: After power-on reset, all three outputs from the count-zero detection circuits are logic '1's disabling all counters. After issuing the load command from the DSP, counter outputs are preset with data from the PMD bus causing the count-zero detectors to change state. Immediately following the loading of the counters, the delay counter is enabled and counts down the delay time in increments of the pulse width clock. When the delay counter has finished (at zero count), the count-zero detector disables the delay counter and simultaneously enables either the signal pulse counter or the compensating pulse counter, depending on the polarity of a signal pulse sign-bit. If the sign of the signal pulse is positive (logic '0'), the signal pulse counter is enabled or if the sign of the signal pulse is negative (logic '1'), the compensating pulse counter is enabled. In a similar manner this intermediate counter decrements to zero causing the corresponding count-zero detector to change state. The intermediate counter is disabled and the last remaining counter becomes enabled similarly decrementing to zero. When all of the counters have finished, they remain disabled until the next load command is issued from the DSP and the PMD word is latched.

The timing difference between the transition of the delay count-zero detector and the intermediate counter's detector determines the time width of the first pulse. Similarly, the timing difference between the transition of the intermediate counter's detector and the last counter's detector determines the time width of the second pulse. Two intermediate signals are generated internal to the waveform generation logic. The H-bridge sign signal (H_SIGN) (Refer to equation described in FIG. 12.) determines the polarity of the power to be delivered by the H-bridge depending upon the signal pulse sign-bit and the states of the detector outputs of the signal and compensating pulse counters. Following the delay, if the sign of the signal pulse is positive and the signal pulse counter is decrementing, the polarity of the H-bridge is positive (H_SIGN='0'). When the signal pulse counter has finished and the compensting pulse counter is decrementing, the sign of the H-bridge is negative (H SIGN='1'). Conversely, when the sign of the signal pulse is negative and the compensating pulse counter is decrementing, the sign of the H-bridge is positive. When the compensating pulse counter has finished and the signal pulse counter is decrementing, the sign of the H-bridge is negative. The H-bridge control signal (H_CTL) (Refer to equation described in FIG. 12) determines when to transition from the damping state to either of the two power states. The damping state is initiated (H_CTL='0') during the delay time and following power delivery, when all of the counters have finished.

The H-bridge control outputs, AHO.Q, ALO.Q, BLO.Q and BHO.Q, are combinations of the two intermediate signals H_SIGN and H_CTL (Refer to equation described in FIG. 12). A logic '1' at a bridge control output causes the corresponding power switch to turn-on. To provide positive power, only AHO and BLO (Refer to equations and control signal outputs shown in FIG. 12) are turned-on. To provide negative power, only BHO and ALO (Refer to equations and control signal outputs shown in FIG. 12) are turned on. To provide damping, only ALO and BLO (Refer to equations and control signal outputs shown in FIG. 12) are turned-on. These logic output control signals are consistent with the inputs required for a known full-bridge driver integrated circuit ("H-Bridge driver circuit"), such as the HIP4081A from Harris Semiconductor, Inc., the specification of which is incorporated herein by reference.

The waveform generation logic outputs, AHO, ALO, BLO and BHO are resynchronized with the pulse width modulation clock prior to applying them to the inputs of the H-Bridge driver circuit, in order to minimize pulse width timing skew and effect deadband timing control. Deadband control refers to the sequence that individual switches within the H-bridge are turned off and turned on, so as to preclude a situation where both upper and lower switches on one side of the bridge are both turned on at the same time, even for a brief moment, producing a short circuit across the power supply. In the prior art, due to the absence of a high speed clock, analog techniques have been used to produce short delays (tens of nanoseconds), required to appropriately sequence the break-before-make switch timing. Empirical observation of these techniques reveals significant variability in these deadband timing delays, which in turn produces pulse width errors that have a detrimental effect on the output linearity of the switch.

Since the design of an all digital amplifier, according to the invention, relies on the use of a high speed clock (PWCLK) to generate the pulse width modulated waveforms, the same timing reference can be used to generate the necessary deadband timing delays required for the power switches, producing a much more stable situation. Thus, the waveform generation logic outputs, AHO, ALO, BLO and BHO are synchronized with the pulse width modulation clock (PWCLK), prior to applying them to the inputs of the H-Bridge driver circuit. Significant improvements in the linearity of the power switch have been demonstrated using this technique.

Control outputs, AHO.Q, ALO.Q, BLO.Q and BHO.Q, from the amplitude to time converter pulse width logic are applied to the control inputs of the HIP4081A H-bridge driver circuit 54, as illustrated in FIG. 10. The HIP4081A circuit is a monolithic, high frequency, medium voltage, N-channel MOSFET H-bridge driver featuring start-up and undervoltage protection and programmable deadband control. The driver has current drive capability required to charge and discharge the MOSFET gate parasitics in a very short time. The driver has been successfully mated with several power MOSFET switches 56, such as the RPF14N05 and RPN25N05 transistors from Harris and also the TPIC5404 integrated full bridge transistor array from Texas Instruments, Inc.

The programmable features of the H-bridge driver circuit may be used in an all digital amplifier according to the invention, to appropriately adjust the individual switch's timing to accomplish a zero-voltage switch transition between the main pulse and the compensating pulse by providing a short period in which none of the switches are turned on. As provided hereinbefore, significant improvement in linearity is achieved by setting the minimum driver delay and using digital control. Since the output filter and load are inductive, the current flowing in the circuit wants to continue flowing in one direction. With the enhancement mode MOSFETs used in the bridge, the current will continue to flow through the body source-drain diodes of the alternate two switches to be turned on, causing the diodes to become forward biased. When the diodes are forward biased, the voltage across the switches is −0.7 V (close enough to zero) and they may now be commanded to turn on. If enhancement mode MOSFETS are not used external diodes can be added. This technique provides higher efficiency, faster switching speeds, and cleaner outputs with reduced EMI, in the context of the embodiment of an all digital amplifier according to the invention.

Two outputs from the power H-bridge driver circuit 54 are applied to the input of a passive LC Butterworth lowpass filter 58 (FIG. 10). The lowpass filter is designed to provide common-mode filtering of the small carrier and harmonics of the signal about the carrier frequency (i.e. at the frame frequency). The filter was optimized for minimal interaction with 4 to 8 ohm loads, flat amplitude response with linear phase in the audio band, group delay, and acceptable carrier suppression. A loudspeaker 60, in this audio embodiment, is connected after the lowpass filter, which is the ultimate transducer for the output of the amplifier.

Figure 13A:
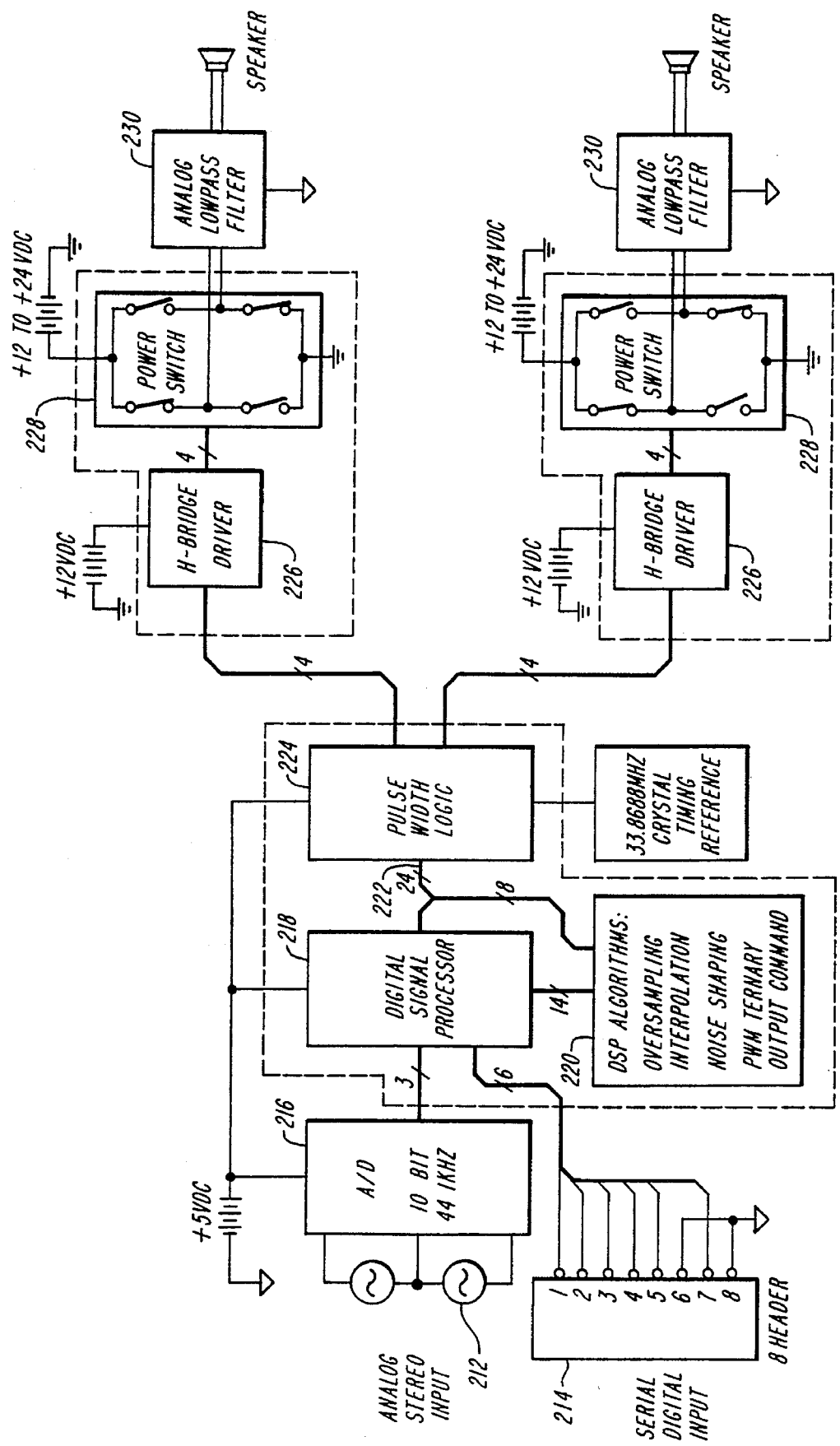
FIG. 13A and 13B are a block diagram and board layout, respectively, of an audio power amplifier embodiment according to the invention.

Digital signal processing according to the invention can be implemented in an all digital, stereo or multichannel high fidelity audio amplifier, as illustrated in FIG. 13A.

As discussed hereinbefore, analog power amplifiers suffer from several disadvantages which have given rise to the development of switch mode, discrete state, power amplifiers. For a given power output, especially at relatively high amplitude levels, analog amplifiers suffer from poor efficiency, primarily because of the need to bias the active elements into linear regions for amplification without distortion. Since the power dissipated in the active elements is substantial, the resulting amplifier efficiency is poor. Additionally, the low efficiency of analog amplifiers results in size and weight penalties due to the need for passive mechanical heat exchangers and the need for larger power supplies to support the wasted energy demand. The consequence of low efficiency is higher cost, because the power handling elements are larger components having higher current carrying capability and wider temperature range of operation, and because the mechanical heat exchangers themselves are a significant portion of the overall amplifier budget.

Furthermore, when the source of the input signal is digital, analog amplifiers have an additional disadvantage since the input formats are fundamentally incompatible, requiring intermediate conversion. This conversion adds complexity and cost to the amplifier and often results in signal degradation. As audio recording, processing and playback progress increasingly into the digital domain, this conversion penalty becomes more prominent, suggesting the need for an economical, high fidelity amplifier whose input is fundamentally digital.

An economical, high efficiency, high fidelity switch mode amplifier can be implemented using the architecture and concepts described hereinbefore with respect to FIGS. 8A, 8B, and 10–12. The third, damped power state of the compensated ternary all digital amplifier according to the invention is especially significant in a high fidelity audio application. During the time when neither supply connection is required, i.e. during the third state, there is virtually no power consumption and both speaker terminals are connected to each other providing excellent amplifier damping to the load. The output switches are "idealized" by the compensation (and preprocessing) mechanisms described in detail hereinbefore, and enabled in response to the digital command that is time modulated by the amplifier's input. The filtered, time modulated output signal yields an analog output at the load transducer that is an amplified replica of the digital audio input signal.

Figure 13B:
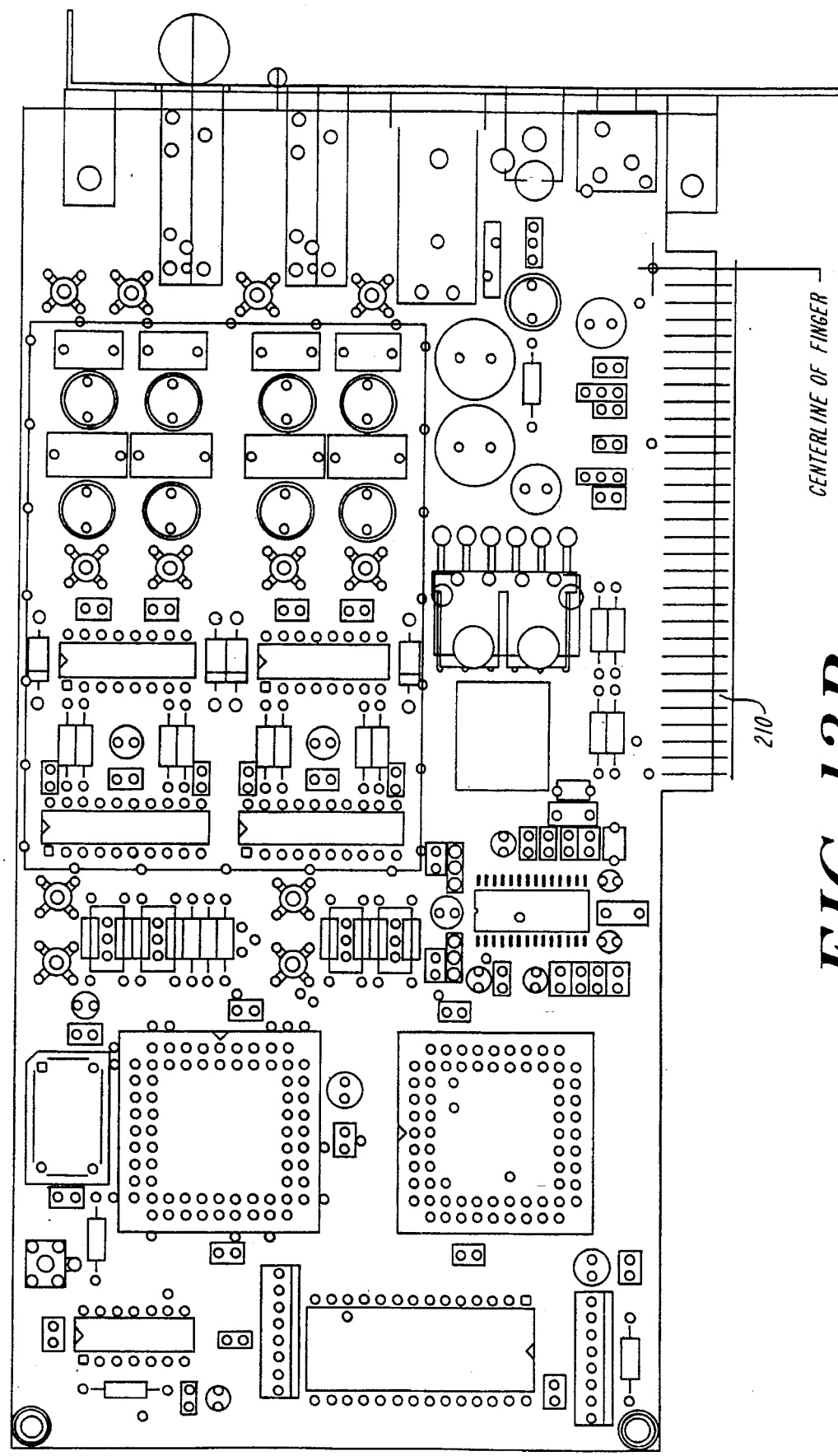

An all digital audio amplifier as illustrated in FIGS. 13A and 13B is useful in contexts such as the personal computer multimedia market. The amplifier has fingers 210 configured to reside on a personal computer's ISA bus slot, and is configured to derive it's source of power from the computer's internal power supply. The amplifier includes an analog input 212 as well as a standard $I^2S$ serial digital input 214.

Signal processing begins at the input to a stereo analog-to-digital converter 216. The A/D is an off-the-shelf, unipolar 5 VDC supply sigma-delta oversampling converter configured for an output sampling frequency of 44.1 KHz and an output wordlength of 16 bits. The A/D converter's analog inputs are AC coupled and filtered to minimize aliasing errors and its' output is ported to the serial input of a digital signal processor 218, which may be the same device and functions the same as the DSP discussed hereinbefore with respect to the embodiments of FIGS. 8A and 8B and 10–12.

The DSP performs a 60 nsec instruction cycle (16.67 MIPS), has 1K words of on-chip program memory RAM, has 512 words of on-chip data memory RAM, and has two double buffered serial ports (SPORTO & 1). The DSP functionality is represented in code stored within a 64K EPROM 220, and effects primarily three signal processing functions—input oversampling interpolation, noise shaping, and pulse width modulation control.

A relatively simple calculation reveals that for data sampled at 44.1 KHz, satisfying the Nyquist criteria for the 20 KHz audio bandwidth, it would require a quantization clock rate nearly 3 GHz to achieve 16-bit quality amplifier performance using PWM techniques, rendering such an amplifier impractical. An oversampling noise shaper, however, can be used to modify the spectrum of quantization noise of a signal within a required bandwidth at the expense of noise elsewhere. This technique permits a finely quantized η-bit input to the oversampling noise shaper to produce a more coarsely quantized η'-bit output from the noise shaper, at the oversampled rate, with η-bit resolution within the audio band. In keeping within the performance constraints of the DSP for a stereo amplifier, a 6× oversampled, 3rd-order noise shaping algorithm was developed and implemented in this application as well as the applications discussed hereinbefore.

A quantization clock rate of 33.8688 MHz was selected, yielding an effective 8-bits control (7-bits width+1-bit polarity) at the oversampled rate. The theoretical signal-to-noise performance of the amplifier using this algorithm is −73.8 dB within the audio band, equivalent to greater than 12-bits, which is not exactly high-end performance but is consistent with multimedia cost objectives. It should be noted that a stereo amplifier could be implemented using a faster performing DSP, using higher oversampling and quantization clock rates, and will theoretically yield 16-bits effective signal-to-noise performance, −96.3 dB within the audio band.

Following the oversampling noise shaper, signal processing proceeds to the pulse width modulation functionality as described. This modulation type is consistent with the compensated ternary output architecture, since information is represented in the width as well as the polarity of regularly occurring pulses. Since the chosen DSP cannot control time at the quantization clock rate, an output command word is issued from a program memory data (PMD) bus 222 of the processor coding left and right channel delay, polarity, and width information. The DSP's PMD bus is then ported to the inputs of a complex programmable logic device 224.

The CPLD 224 features in system programmability, 4000 gates, 48 I/O pins, 144 registers, and a 60 MHz $f_{max}$ rating. The function of the CPLD 224 is to decode the commands from the PWM algorithm into precisely defined width pulses centered on regular timing intervals, which are an integral multiple of the quantization clock period, as discussed hereinbefore with respect to other embodiments.

The PMD bus 222 output from the DSP 218 is latched at the inputs to the CPLD 224 and, as with the output of the PMD bus discussed, counters are loaded with appropriate values for pulse delay and width. The counters are clocked until empty, with the logic outputs set when the counters are started, and reset when the counters have finished. The logic outputs are registered, so as to remove any timing skew, and ported to the inputs of the power switch drivers 226 which are provided for each channel.

As before, the power switch drivers are monolithic, high frequency, medium voltage, N-Channel MOSFET H-Bridge drive IC's featuring start-up and undervoltage protection and programmable dead-band control. The drivers afford independent control of the four N-Channel devices from logic level inputs. The driver's outputs are configured to the power switches 228.

The power switches 228 are monolithic N-Channel power MOSFET transistor arrays configured into an H-Bridge. The switches feature a 60 V breakdown rating, a 0.3 Ω on resistance per switch, a 2A continuous, 10A maximum current rating, and flyback protection for inductive loads. The power switches were selected for their low cost, small size, and matching characteristics for the application. These devices illustrate the elegance of ternary operation. The entire power output stage for a 50 Watt audio amplifier (24 VDC power supply into 4 Ω driven by a dynamic musical input) is contained within one 16-pin DIP. The switches have been evaluated driving 4 Ω to 8 Ω loads, achieving good performance. The outputs from the H-Bridge power switches are configured to the output analog lowpass filters 230.

The output filters 230 are passive LC type Butterworth lowpass filters using a 24 dB per octave slope pitched above the audio bandwidth. The filters were designed for minimal interaction with 4 to 8 ohm loads, optimized for component's size, flat amplitude response with linear phase in the audio band, group delay, and acceptable carrier suppression. The loudspeaker loads are connected after the lowpass filter 230, which is the output of the amplifier.

Essentially, but for device specifications particular to the multimedia PC application, the embodiment represented in FIGS. 13A and 13B is identical in functionality to the embodiments discussed hereinbefore. Five basic components; initialization, oversampling filter, harmonic compensation, noise shaping, and output logic, are effected. Because the essential functional elements were discussed in great detail hereinbefore, each is briefly described hereinafter.

At power up initialization, any program variables and array pointers are initialized, and the DSP serial ports are set up as known in the art. The serial ports are initialized to use autobuffer format that reads four 16 bit words. The autobuffer mode will cause the serial port to generate an interrupt after 48 bits of data are received, at 44.1 kHz. This interrupt is used to start the signal processing after the initialization is complete.

The first signal processing task is effected by the oversampling filter. A multi-tap oversampling FIR is used to generate N samples from the 16 bit linear PCM data read. The FIR coefficients were computed to produce a low pass filter that encompasses the full audio bandwidth (20 kHz) while attenuating sampling images. The number of taps was maximized to the throughput capability of the device.

Ordinarily, as described hereinbefore, the N samples from the oversampling filter would include pre-compensation for the harmonic distortion induced by the linearizing output pulse and the modulation scheme. This was accomplished and demonstrated for the second harmonic using a single channel implementation as described. Due to cost and performance constraints of this PC application and design, harmonic compensation was not implemented in the presently described stereo version. However, one of ordinary skill in the art will appreciate that where cost and performance considerations are not so constrained, harmonic compensation may be implemented according to the invention.

The oversampled data are processed through a third order noise shaper to reduce the 16 bit data down to the output quantization level. This processing shifts the quantization noise outside the audio bandwidth. The noise shaper output data points are stored in a circular buffer array that is accessed by the output logic. A double buffer scheme is used to prevent simultaneous array reads and writes.

The DSP timer interrupt is used to execute the output logic N times per 44.1 kHz cycle. Once the output logic is executed, the DSP is returned to the normal processing. The DSP timer is set up during initialization and is locked to the 44.1 kHz cycles.

The output logic uses the noise shaper output to access a data array effecting the modulation counters. A pointer is set to the center of this counter data array and the pointer is shifted by the value of the noise shaper output. This array element is then output by writing to external program memory. The counter data is 24 bits wide and includes the delay counter, a first pulse counter, and a second pulse counter. These counters control the amplifier output level during each of the N frames per 44.1 kHz cycle. The delay counter indicates a zero state, and the sign of the first and second counters indicated a positive or negative output, as discussed hereinbefore.

Although the previous embodiments only showed a single channel, and the embodiment of FIG. 13A shows two channels or a stereo application, it will be appreciated that an all digital amplifier implemented according to the invention can be implemented for one, two, four or N channel performance.

Although the invention is shown and described in an illustrative embodiment of a switching amplifier and more particularly as audio amplifiers, it will be appreciated that the invention described hereinbefore can be implemented in numerous other applications, such as servo motor amplifiers or synthesized AC power sources or the like.

Furthermore, regardless of the fact that the signal processing described herein is implemented as a code driven DSP, it will be appreciated that the signal processing according to the invention could be implemented as hardwired and/or code driven elements in an application specific integrated circuit, or as processes running on a microprocessor or the like.

While a pre-compensated look-up table is used hereinbefore to compensate the output nonlinearity of the power switch, it will be appreciated that where the time resolution of signal processors is adequate, it may be possible to directly model the zero cross transition of the power switch.

Although a 24 bit PMD bus is described in the embodiments herein for outputting information from the DSP, it will be appreciated that alternative interfaces, such as serial interfaces may be implemented by those skilled in the art. Additionally, alternative coded output formats requiring fewer or more than 24 bits are possible dependent upon circuit partitioning.

Although the invention is described hereinbefore with respect to illustrative embodiments thereof, it will be appreciated that the foregoing and various other changes, omissions and additions in the form and detail thereof may be made without departing from the spirit and scope of the invention.

What is claimed is:

1. A method for linearizing the output of at least one power switch having switch timing error in an amplifier receiving an input signal and providing a switched output signal, said method comprising the steps of:

producing a compensated composite waveform by modulating said input signal with a bi-state compensating pulse waveform; and effecting common mode cancellation of said switch timing error by passing said compensated composite waveform through said at least one power switch having switch timing error to provide said switched output signal.

2. The method of claim 1 wherein said bi-state compensating pulse waveform includes a first state portion which is a function of switch timing error, and a second state portion having a minimum pulse width that is a function of said input signal and said switch timing error.

3. The method of claim 1 wherein said bi-state compensating waveform has a pulse width that is produced by accessing a lookup table in memory.

4. The method of claim 1 further including a step of pre-compensating said input signal by determining a modulation induced distortion and applying an inverse of said modulation induced distortion to said input signal.

5. The method of claim 4 wherein coefficients used to determine said inverse of said modulation induced distortion are stored in a look up table referenced by an estimated amplitude of said input signal.

6. The method of claim 1 wherein said at least one power switch comprises a plurality of power switches and said method further includes the step of:

controlling accuracy of timing and a sequence in which individual ones of said plurality of power switches are turned off and turned on to substantially avoid a short circuit of any duration across a power supply controlled by said plurality of switches.

7. The method of claim 1 wherein said at least one power switch comprises a plurality of power switches and said method further includes a step of:

processing a portion of said input signal to produce an oversampled input signal having a fixed length and a fixed frequency; and controlling accuracy of timing and a sequence in which individual ones of said plurality of power switches are turned off and turned on to substantially avoid a short circuit of any duration across a power supply controlled by said plurality of switches.

8. The method of claim 7 wherein said step of controlling accuracy of timing and a sequence in which individual ones of said plurality of power switches are turned off and turned on, involves using a high speed digital clock to control timing and said sequence, said high speed digital clock being synchronous with said fixed frequency of said oversampled input signal.

9. The method of claim 1 wherein said at least one power switch comprises a plurality of power switches and each of said plurality of power switches comprises an enhancement mode MOSFET.

10. A tri-state digital switching amplifier receiving an input signal and having a plurality of output modes including a first mode, a second mode and a third mode, and providing a switched output signal, comprising:

a digital signal processor receiving said input signal and processing said input signal by modulating said input signal with a bi-state compensating pulse waveform to produce a compensated input signal;

at least one power switch including switch timing error and effecting switching between said first mode, said second mode and said third mode, said at least one power switch receiving said compensated input signal from said digital signal processor and outputting said compensated input signal in at least one of said first mode, said second mode and said third mode to provide said switched output signal substantially free of said switch timing error.

11. The tri-state digital switching amplifier of claim 10 wherein said bi-state compensating pulse waveform includes a first state portion which is a function of switch timing error, and a second state portion having a minimum pulse width that is a function of said input signal and said switch timing error.

12. The tri-state digital switching amplifier of claim 10 wherein said bi-state compensating waveform has a pulse width that is produced by accessing a lookup table in memory.

13. The tri-state digital switching amplifier of claim 10 wherein said digital signal processor includes a pre-compensation mechanism pre-compensating said input signal by determining a modulation induced distortion and applying an inverse of said modulation induced distortion to said input signal.

14. The tri-state digital switching amplifier of claim 13 further including a memory accessible by said digital signal processor and wherein coefficients used to determine said inverse of said modulation induced distortion are stored in a look up table in said memory referenced by an estimated amplitude of said input signal.

15. The tri-state digital switching amplifier of claim 10 wherein said at least one power switch comprises a plurality of power switches and said amplifier further includes a synchronization and timing control mechanism in communication with said plurality of power switches to control accuracy of timing and a sequence in which individual ones of said plurality of power switches are turned off and turned on to substantially avoid a short circuit across a power supply controlled by said plurality of switches.

16. The tri-state digital switching amplifier of claim 10 wherein said digital signal processor includes an input oversampling mechanism processing a portion of said input signal to produce an oversampled input signal having a fixed length and a fixed frequency and further including a synchronization and timing control mechanism in communication with said plurality of power switches to control accuracy of timing and a sequence in which individual ones of said plurality of power switches are turned off and turned on to substantially avoid a short circuit of any duration across a power supply controlled by said plurality of switches.

17. The tri-state digital switching amplifier of claim 16 wherein a high speed digital clock is used to control timing and said sequence, said high speed digital clock being synchronous with said fixed frequency of said oversampled input signal.

18. The tri-state digital switching amplifier of claim 10 wherein said at least one power switch comprises a plurality of power switches and each of said plurality of power switches comprises an enhancement mode MOSFET.

* * * * *